(12) United States Patent
Ueno

(10) Patent No.: US 7,576,382 B2
(45) Date of Patent: Aug. 18, 2009

(54) SEMICONDUCTOR INTEGRATED DEVICE AND METHOD OF PROVIDING SHIELD INTERCONNECTION THEREIN

(75) Inventor: Tsuyoshi Ueno, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 400 days.

(21) Appl. No.: 11/344,191

(22) Filed: Feb. 1, 2006

(65) Prior Publication Data

US 2006/0192288 A1 Aug. 31, 2006

(30) Foreign Application Priority Data

Feb. 2, 2005 (JP) ............................. 2005-026600

(51) Int. Cl.
H01L 27/108 (2006.01)
H01L 29/94 (2006.01)

(52) U.S. Cl. ...................... 257/306; 257/393; 438/396; 438/622

(58) Field of Classification Search ................. 257/306, 257/393; 438/396, 622
See application file for complete search history.

(56) References Cited

U.S. PATENT DOCUMENTS 6,066,537 A 5/2000 Poh

2003/0062564 A1 4/2003 Kobayashi et al.

FOREIGN PATENT DOCUMENTS

| EP | 0 353 426 | 2/1990 |
|----|-----------|--------|
| JP | 5-47943 | 2/1993 |
| JP | 2000-58752 | 2/2000 |
| JP | 2000-150802 | 5/2000 |
| JP | 2000-269211 | 9/2000 |
| JP | 2000-353785 | 12/2000 |
| JP | 2001-44305 | 2/2001 |
| JP | 2001-144091 | 5/2001 |

*Primary Examiner*—Fernando L Toledo
(74) *Attorney, Agent, or Firm*—Dickstein Shapiro LLP

(57) ABSTRACT

A method of providing shield interconnection, the method shielding an interconnection pattern to be shielded with shield interconnection patterns for shielding on the substrate of a semiconductor integrated device, is disclosed. The method includes the steps of disposing multiple interconnection layers having the corresponding shield interconnection patterns formed therein so that the interconnection layers surround the interconnection pattern to be shielded; setting different potentials for at least a first one of the shield interconnection patterns formed in a first one of the interconnection layers and a second one of the shield interconnection patterns formed in a second one of the interconnection layers; and shielding the interconnection pattern to be shielded with the first one and the second one of the shield interconnection patterns.

6 Claims, 13 Drawing Sheets

SEMICONDUCTOR INTEGRATED DEVICE AND METHOD OF PROVIDING SHIELD INTERCONNECTION THEREIN

BACKGROUND OF THE INVENTION

1. Field of the Invention

The present invention relates to a semiconductor integrated device and a method of providing shield interconnection therein.

2. Description of the Related Art

As LSIs have become larger in scale because of a recent advancement of microfabrication in the semiconductor process, it has been possible to provide both a digital signal processing circuit and an analog circuit in a single chip. Inside this circuit where the analog circuit and the digital circuit coexist, an interconnection line for an analog signal required to be highly accurate and an interconnection line for a binary digital signal operating at high frequencies may be provided next to each other, so that a noise interference channel caused by the capacitance between the analog signal line and the digital signal line may exist. In particular, digital signals usually have an amplitude of several volts and perform high-speed transition. Accordingly, noise is mixed into the analog signal line through the capacitance between the analog signal line and the digital signal line, thus causing a problem in that the analog signal cannot be processed with accuracy. Therefore, in semiconductor integrated devices in which an analog circuit susceptible to noise and a high-frequency digital circuit coexist, an attempt has been made to avoid inconvenience such as malfunction due to noise by designing interconnection (providing a layout) so that a first interconnection layer formed of a digital signal line (a high-frequency signal line) and a second interconnection layer formed of an analog signal line cross each other with only an interlayer insulating film therebetween, or the first interconnection layer and the second interconnection layer are totally separated so as not to cross each other.

Further, Japanese Laid-Open Patent Application No. 5-47943 (hereinafter, JP5-47943) discloses a conventional semiconductor integrated device having a multi-interconnection-layer configuration, wherein a first interconnection layer (analog signal interconnection pattern) and a second interconnection layer (digital signal interconnection pattern) are provided; a third interconnection layer is disposed between the first interconnection layer and the second interconnection layer at the intersection thereof; a fourth interconnection layer is disposed below the first interconnection layer; each of the third interconnection layer and the fourth interconnection layer (shield interconnection) is larger in area than the interconnection area part of the first interconnection layer and the second interconnection layer; a contact connecting the third interconnection layer and the fourth interconnection layer is provided on each side of the first interconnection layer; and each of the third interconnection layer and the fourth interconnection layer is provided with a fixed potential. This is known as an interconnection design (layout) method to reduce noise caused on an analog signal line by a digital signal line.

However, according to the conventional semiconductor integrated device disclosed in JP5-47943, there is a problem in that if a circuit element (for example, an output buffer) driving a signal transmitted through the first interconnection layer or the second interconnection layer (for example, a digital signal) has high driving capability, the potential of the third interconnection layer serving as a shield interconnection layer varies by way of electromagnetic induction, so that noise is mixed into the analog signal line provided in the first interconnection layer through the capacitance between the signal interconnection patterns of the second and third interconnection layers and the capacitance between the signal interconnection patterns of the third and first interconnection layers. Further, with respect to the interclock skew of a multiphase clock signal generated by PLL (Phase Locked Loop), the difference in parasitic capacitance between clock signal lines is a problem in particular. Further, as a result of recent progress in process microfabrication, clock signals operate at a frequency of several GHz. Accordingly, the output buffer increases its driving capability in order to transmit this high-frequency clock signal, thus making it necessary to consider effects on other signal lines.

SUMMARY OF THE INVENTION

Accordingly, it is a general object of the present invention to provide a semiconductor integrated device and a method of providing shield interconnection therein in which the above-described disadvantages are eliminated.

A more specific object of the present invention is to provide a semiconductor integrated device and a method of providing shield interconnection therein capable of reducing noise mixed into an analog signal line or other signal lines by a digital signal.

The above objects of the present invention are achieved by a method of providing shield interconnection, the method shielding an interconnection pattern to be shielded with shield interconnection patterns for shielding on a substrate of a semiconductor integrated device, the method including the steps of: disposing a plurality of interconnection layers having the corresponding shield interconnection patterns formed therein so that the interconnection layers surround the interconnection pattern to be shielded; setting different potentials for at least a first one of the shield interconnection patterns formed in a first one of the interconnection layers and a second one of the shield interconnection patterns formed in a second one of the interconnection layers; and shielding the interconnection pattern to be shielded with the first one and the second one of the shield interconnection patterns.

The above objects of the present invention are also achieved by a semiconductor integrated device, including: a first interconnection layer in which a first shield interconnection pattern fixed to a first potential is provided; a second interconnection layer in which a second shield interconnection pattern fixed to a second potential is provided; a third interconnection layer in which an interconnection pattern to be shielded is provided; and a connection part configured to connect the first, second, and third interconnection layers, the first, second, and third interconnection layers being on a substrate of the semiconductor integrated device, wherein the third interconnection layer is provided between the first interconnection layer and the second interconnection layer; the connection part is connected to the first shield interconnection pattern so as to communicate from the first interconnection layer with the second interconnection layer through the third interconnection layer with the interconnection pattern to be shielded being provided between first and second parts of the connection part; and the first shield interconnection pattern, the connection parts connected thereto, and the second shield interconnection pattern surround and shield the interconnection pattern to be shielded.

The above objects of the present invention are also achieved by a semiconductor integrated device, including: a first interconnection layer in which a first shield interconnection pattern fixed to a first potential is provided; a second interconnection layer in which a second shield interconnection pattern fixed to a second potential is provided; a third interconnection layer in which a third shield interconnection pattern fixed to the second potential is provided, the third interconnection layer being separated from the second interconnection layer; a fourth interconnection layer in which a first interconnection pattern to be shielded is provided; a fifth interconnection layer in which a second interconnection pattern to be shielded is provided, the fifth interconnection layer being separated from the fourth interconnection layer; a first connection part configured to connect the first, second, and fourth interconnection layers; and a second connection part configured to connect the first, third, and fifth interconnection layers, the first, second, third, fourth, and fifth interconnection layers and the first and second connection parts being on a substrate of the semiconductor integrated device, wherein the fourth interconnection layer is provided between the first interconnection layer and the second interconnection layer, and the first connection part connected to the first shield interconnection pattern communicates from the first interconnection layer with the second interconnection layer through the fourth interconnection layer with the first interconnection pattern to be shielded being provided between first and second parts of the first connection part, so that the first shield interconnection pattern, the first connection part connected thereto, and the second shield interconnection pattern surround the first interconnection pattern to be shielded; and the fifth interconnection layer is provided between the first interconnection layer and the third interconnection layer, and the second connection part connected to the first shield interconnection pattern communicates from the first interconnection layer with the third interconnection layer through the fifth interconnection layer with the second interconnection pattern to be shielded being provided between first and second parts of the second connection part, so that the first shield interconnection pattern, the second connection part connected thereto, and the third shield interconnection pattern surround the second interconnection pattern to be shielded; thereby shielding the first interconnection pattern to be shielded and the second interconnection pattern to be shielded separately.

The above objects of the present invention are also achieved by a semiconductor integrated device, including: a first interconnection layer in which a first shield interconnection pattern fixed to a first potential is provided; a second interconnection layer in which a second shield interconnection pattern fixed to a second potential is provided; a third interconnection layer in which a first interconnection pattern to be shielded is provided; a fourth interconnection layer in which a second interconnection pattern to be shielded is provided, the fourth interconnection layer being separated from the third interconnection layer; a first connection part configured to connect the first, second, and third interconnection layers; a second connection part configured to connect the first, second, and fourth interconnection layers; and a third connection part configured to connect the first, third, and fourth interconnection layers, the first, second, third, and fourth interconnection layers and the first, second, and third connection parts being on a substrate of the semiconductor integrated device, wherein the third and fourth interconnection layers are provided between the first interconnection layer and the second interconnection layer, the first connection part connected to the first shield interconnection pattern communicates from the first interconnection layer with the second interconnection layer through the third interconnection layer while opposing the first interconnection pattern to be shielded, the second connection part connected to the first shield interconnection pattern communicates from the first interconnection layer with the second interconnection layer through the fourth interconnection layer while opposing the second interconnection pattern to be shielded, and the third connection part connected to the first shield interconnection pattern passes between the first and second interconnection patterns to be shielded so as to communicate from the first interconnection layer with the third and fourth interconnection layers, so that the first shield interconnection pattern, the first and third connection parts connected thereto, and the second shield interconnection pattern surround the first interconnection pattern to be shielded, and the first shield interconnection pattern, the second and third connection parts connected thereto, and the second shield interconnection pattern surround the second interconnection pattern to be shielded, thereby shielding the first and second interconnection patterns to be shielded with the second shield interconnection pattern being shared between the first and second interconnection patterns to be shielded.

According to one aspect of the present invention, it is possible to provide a method of providing shield interconnection capable of reducing noise mixed into an analog signal and other signal lines by a digital signal.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given below, with reference to the accompanying drawings, of embodiments of the present invention.

First Embodiment

Figure 1:
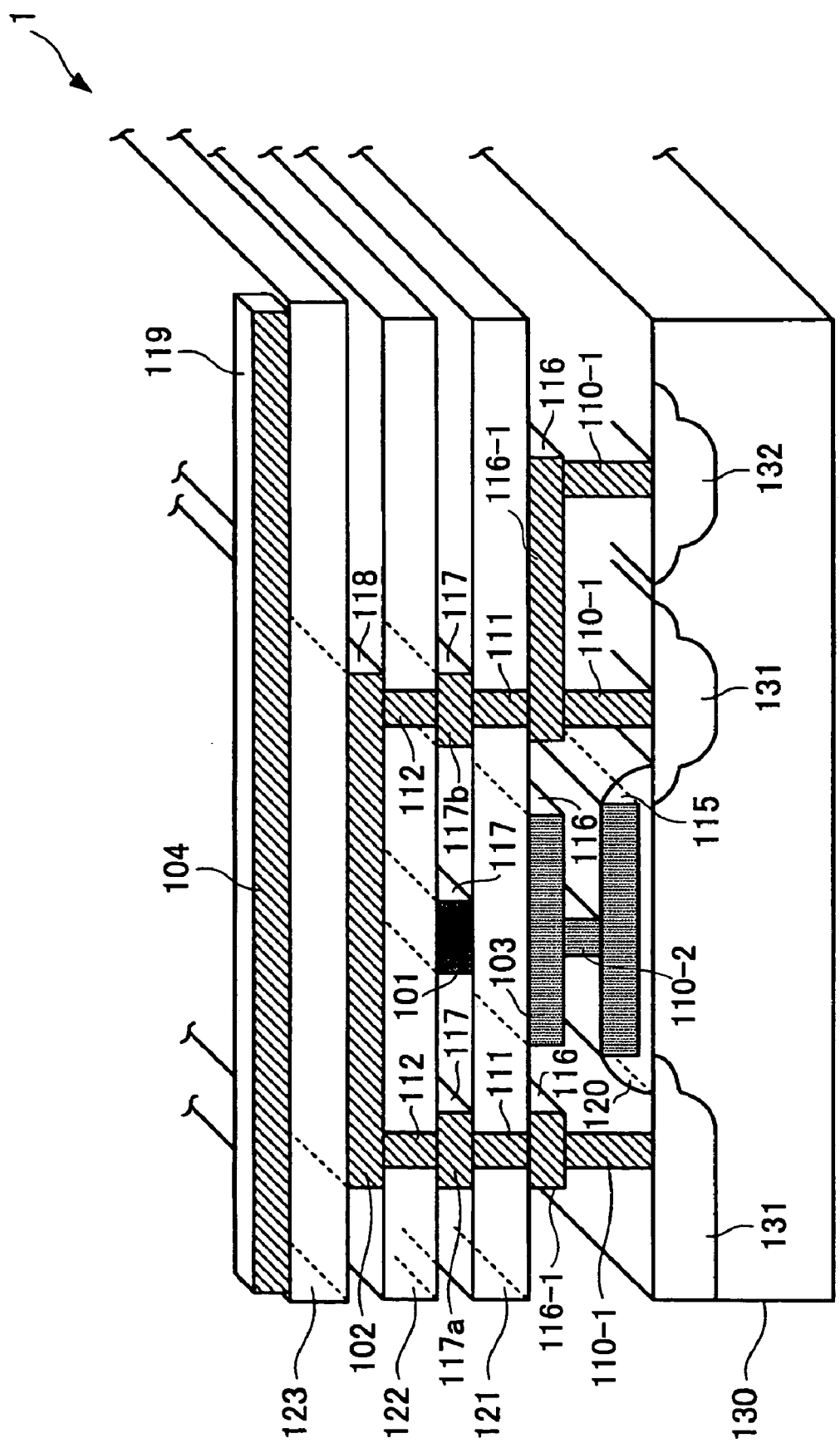
FIG. 1 is a perspective view of a semiconductor integrated device according to a first embodiment of the present invention.

FIG. 1 is a diagram showing a layout configuration of a semiconductor integrated device 1 according to a first embodiment of the present invention.

Referring to FIG. 1, the semiconductor integrated device 1 includes a p-type substrate 130, multiple interconnection layers 115, 116, 117, 118, and 119 formed on the substrate 130, and multiple interlayer insulating films (hereinafter referred to as "insulating films") 120, 121, 122, and 123 each formed between corresponding two of the substrate 130 and the interconnection layers 115 through 119.

A shielded interconnection pattern (or an interconnection pattern to be shielded) 101, formed of a signal line that is a target of shielding (also referred to as "shielding target signal line"), is provided in the same layer as the interconnection layer 117. The interconnection layer 118 is stacked on the interconnection layer 117 with the insulating film 122 therebetween. A first shield interconnection pattern 102 formed of a signal line for shielding is provided in the interconnection layer 118. The interconnection layer 117 is stacked on the interconnection layer 116 with the insulating film 121 therebetween. A second shield interconnection pattern 103 formed of a signal line for shielding is provided in the interconnection layer 116. The interconnection layer 116 is divided so that a connection part 116-1 connecting contacts 110-1 and 111 is provided where the second shield interconnection pattern 103 is not provided in the interconnection layer 116.

The first shield interconnection pattern 102 is connected to contacts 112 buried in the insulating film 122. The contacts 112 are connected to corresponding connection parts 117a and 117b of the interconnection layer 117. The connection parts 117a and 117b are connected to the corresponding contacts 111 buried in the insulating film 121. The contacts 111 are connected to the corresponding connection parts 116-1 of the interconnection layer 116. The connection parts 116-1 are connected to the corresponding contacts 110-1 connecting the interconnection layer 116 and diffusions 131 and 132 inside the substrate 130. Accordingly, the first shield interconnection pattern 102 communicates from the interconnection layer 118 with the diffusions 131 and 132 inside the substrate 130 through the insulating film 122, the interconnection layer 117, the insulating film 121, and the interconnection layer 116. In other words, the first shield interconnection pattern 102 is provided above the shielded interconnection pattern 101 provided in the interconnection layer 117 so as to surround the shielded interconnection pattern 101 with extensions down to the substrate 130 on both lateral sides of the shielded interconnection pattern 101.

The second shield interconnection pattern 103 is provided in the interconnection layer 116 below the interconnection layer 117 in which the shielded interconnection pattern 101 is provided. Further, the second shield interconnection pattern 103 communicates with the interconnection layer 115 through a contact 110-2 connecting the interconnection layers 115 and 116. The insulating film 120 is formed between the interconnection layer 115 and the substrate 130.

Either an analog signal, which is required to be highly accurate, or a high-frequency digital signal may be transmitted through the shielded interconnection pattern 101. A signal line 104 other than the above-described shielding target signal line and signal lines for shielding (hereinafter referred to as "the other signal line 104") is provided in the interconnection layer 119 above the interconnection layer 118 in which the first shield interconnection pattern 102 is provided. The insulating film 123 is formed between the interconnection layer 118 and the interconnection layer 119. This configuration causes the first shield interconnection pattern 102 to suppress electric lines of force affecting the other signal line 104 from the shielded interconnection pattern 101 or electric lines of force affecting the shielded interconnection pattern 101 from the other signal line 104.

Figure 2:
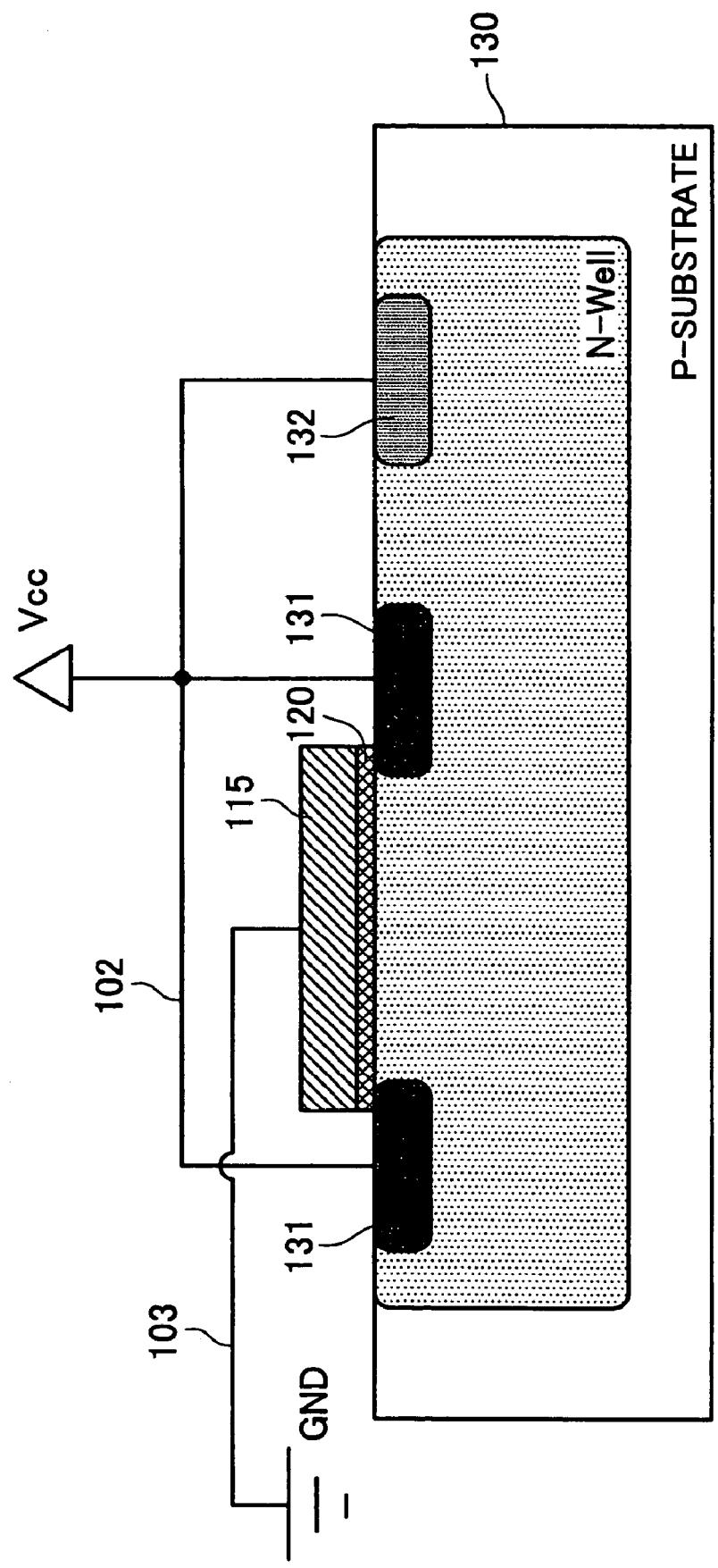
FIG. 2 is a cross-sectional view of a substrate and its vicinity of the semiconductor integrated device according to the first embodiment of the present invention.

Further, according to this embodiment, the first shield interconnection pattern 102 and the second shield interconnection pattern 103 are provided with different potentials. FIG. 2 shows the case where the first shield interconnection pattern 102 is provided with a higher potential than the second shield interconnection pattern 103.

Referring to FIG. 2, the substrate 130 is a p-type substrate in which an n-type impurity (N-Well) is implanted. Further, the diffusions 131 formed in the substrate 130 are p-type diffusions (P+ diffusions) and the diffusion 132 equally provided with a substrate potential is an n-type diffusion (N+ diffusion). The first shield interconnection pattern 102 is provided with Vcc (supply voltage), and the second shield interconnection pattern 103 is connected to GND (ground). Further, the interconnection layer 115 is formed of polysilicon, and the insulating film 120 is a gate oxide film (for example, a SiO2 coating). Further, the interconnection layer 115 is the gate electrode of a CMOS transistor, and the corresponding diffusions 131 form the drain and the source of the CMOS transistor. Thus, the circuit diagram is as shown in FIG. 2. Here, if the gate voltage is lower than a threshold voltage Vth, a channel appears in the region immediately under the insulating film 120 that is a gate oxide film, so that gate capacitance is formed. The gate capacitance is coupling capacitance combining the capacitance between the gate and the drain, the capacitance between the gate and the source, and the capacitance between the gate and the substrate 130. This gate capacitance is the capacitance between the first and second shield interconnection patterns 102 and 103 of different potentials. The capacitance between the first and second shield interconnection patterns 102 and 103 exists in the vicinity of the interconnection part where the electric lines of force from the shielded interconnection pattern 101 or the electric lines of force from the other signal line 104 affect the first shield interconnection pattern 102 and the second shield interconnection pattern 103. Accordingly, it is possible to reduce the effect.

That is, the first shield interconnection pattern 102 is disposed in order to prevent the noise interference between the shielded interconnection pattern 101 and the other signal line 104. For example, it is assumed that the other signal line 104 is a noise source and the shielded interconnection pattern 101 is to be protected from noise. In this case, the noise interference from the other signal line 104 to the shielded interconnection pattern 101 is reduced by the first shield interconnection pattern 102, while noise interference is caused to the first shield interconnection pattern 102 from the other signal line 104. Therefore, capacitance is added (as a decoupling capacitor) in order to stabilize the potentials supplied to the first shield interconnection pattern 102 and the second shield interconnection pattern 103. On the other hand, the noise interference between the shielded interconnection pattern 101 and the other signal line 104 is also reduced by disposing the first and second shield interconnection patterns 102 and 103 whose potentials are stabilized by the added capacitance.

The semiconductor integrated device 1 according to the first embodiment of the present invention includes the interconnection layers 115 through 119; the shielded interconnection pattern 101; and the first shield interconnection pattern 102 and the second shield interconnection pattern 103 of different potentials around the shielded interconnection pattern 101, wherein capacitance is added to the first and second shield interconnection patterns 102 and 103 of different potentials. As a result, according to the semiconductor integrated device 1, it is possible to reduce the effect of the signal of the shielded interconnection pattern 101 on the other signal line 104 or the effect of the other signal line 104 on the shielded interconnection pattern 101.

Second Embodiment

Figure 3:
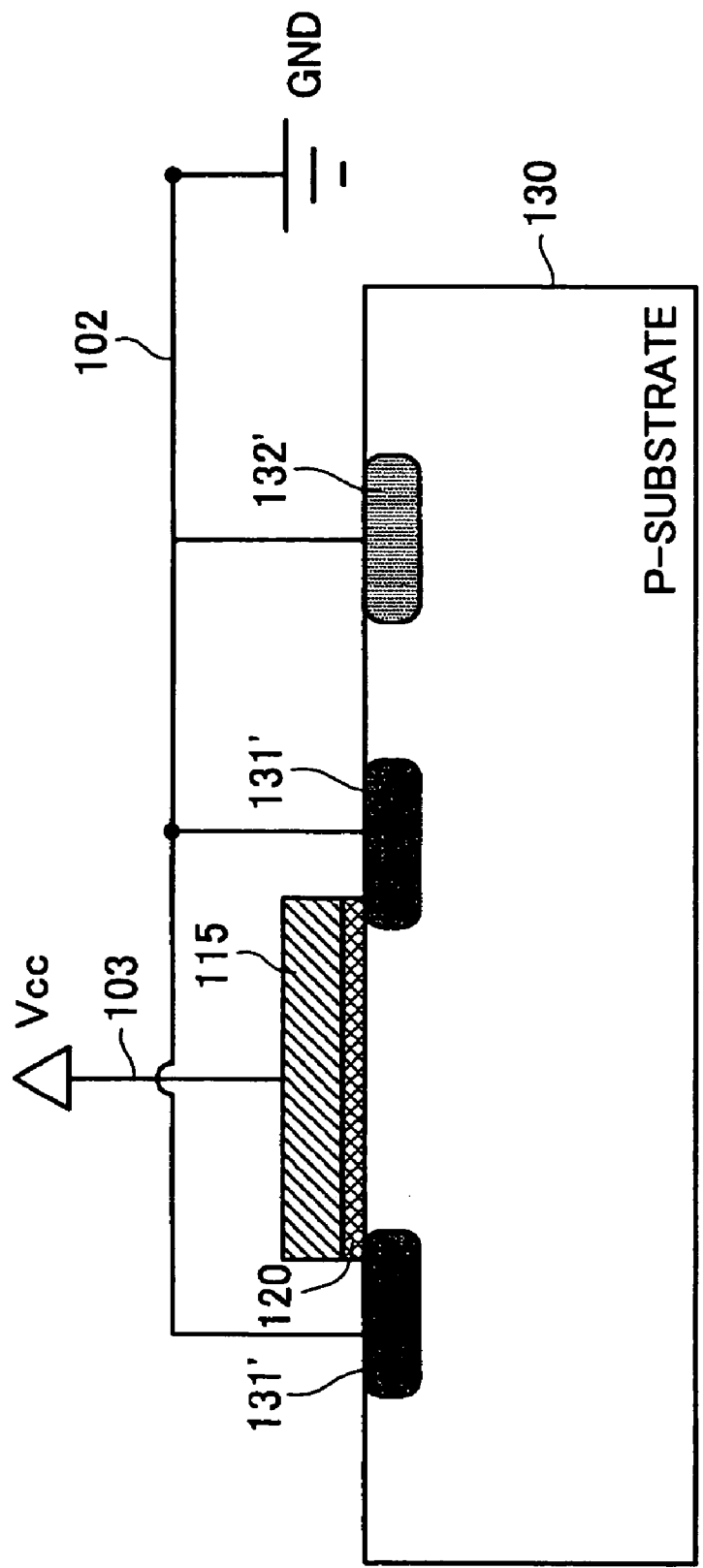
FIG. 3 is a cross-sectional view of the substrate and its vicinity of the semiconductor integrated device according to a second embodiment of the present invention.

Next, FIG. 3 is a diagram showing a layout configuration of the semiconductor integrated device 1 according to a second embodiment of the present invention. According to this embodiment, the first shield interconnection pattern 102 is provided with a lower voltage than the second shield interconnection pattern 103. In this embodiment, the same elements as those of the first embodiment are referred to by the same numerals, and a description thereof is omitted.

Referring to FIG. 3, the substrate 130 is a p-type substrate, diffusions 131' are N+ diffusions, and a diffusion 132' providing a substrate potential is a P+ diffusion. Here, the first shield interconnection pattern 102 connected to the diffusions 131' and 132' is connected to GND, and the interconnection layer 115 that is a gate electrode is provided with Vcc. The interconnection layer 115 that is a gate electrode is polysilicon, and the insulating film 120 serving as an interlayer insulating film is a gate oxide film. In this case, when Vcc is higher than or equal to the threshold voltage Vth, the above-described gate capacitance is also formed. Accordingly, it is possible to add capacitance between the first and second shield interconnection patterns 102 and 103 of different potentials. This capacitance between the first and second shield interconnection patterns 102 and 103 makes it possible to reduce the effect on the first and second shield interconnection patterns 102 and 103 in the same manner as described above.

The semiconductor integrated device 1 according to the second embodiment of the present invention includes the interconnection layers 115 through 119; the shielded interconnection pattern 101; and the first shield interconnection pattern 102 and the second shield interconnection pattern 103 of different potentials around the shielded interconnection pattern 101, wherein capacitance is added between the first and second shield interconnection patterns 102 and 103 of different potentials. As a result, according to the semiconductor integrated device 1, it is possible to reduce the effect of the signal of the shielded interconnection pattern 101 on the other signal line 104 or the effect of the other signal line 104 on the shielded interconnection pattern 101.

Third Embodiment

Figure 4:
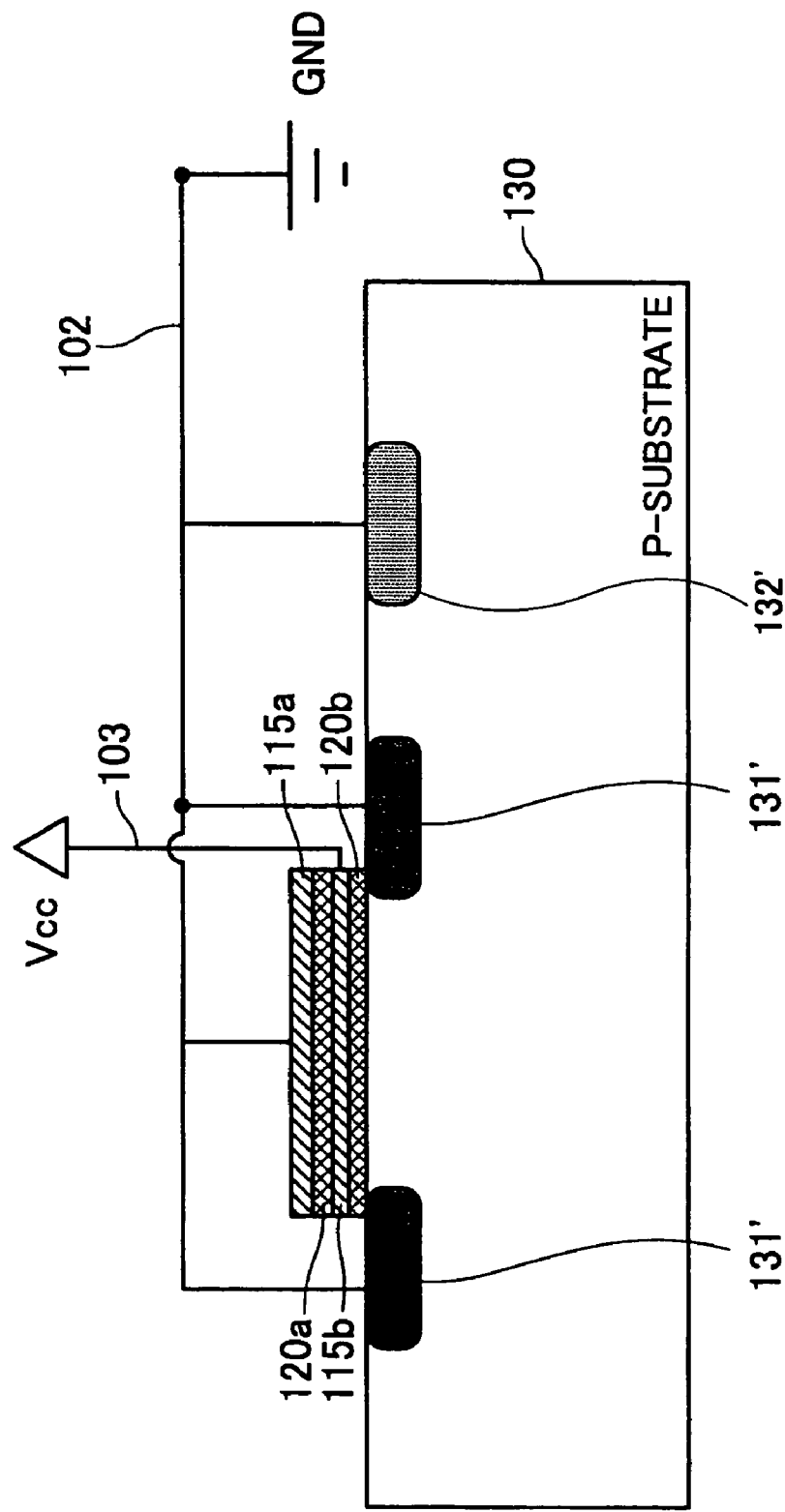
FIG. 4 is a cross-sectional view of the substrate and its vicinity of the semiconductor integrated device according to a third embodiment of the present invention.

Next, FIG. 4 is a diagram showing a layout configuration of the semiconductor integrated device 1 according to a third embodiment of the present invention. According to this embodiment, the interconnection layer 115 that is a gate electrode is formed of multiple polysilicon layers (for example, two polysilicon layers) in accordance with the type of a semiconductor manufacturing process. In this embodiment, the same elements as those of the first and the second embodiments are referred to by the same numerals, and a description thereof is omitted.

Referring to FIG. 4, a polysilicon layer 115a is connected to GND, and a polysilicon layer 115b on an insulating layer (gate oxide film) 120b is connected to Vcc. An insulating layer (gate oxide film) 120a is formed between the polysilicon layers 115a and 115b. The polysilicon layer 115a and the polysilicon layer 115b are connected to different potentials. Accordingly, it is possible to add inter-polysilicon capacitance as a parallel plate capacitor with the different polysilicon layers 115a and 115b serving as electrodes. It is possible to add further capacitance to the above-described method of providing shield interconnection by which method gate capacitance is added between the first and second shield interconnection patterns 102 and 103. That is, it is possible to realize a method of providing shield interconnection which method reduces the effect of the shielded interconnection pattern 101 and the other signal line 104 on the shield interconnection patterns 102 and 103. In the case of more polysilicon layers, it is possible to add more capacitance by connecting the polysilicon layers alternately to Vcc and GND. Further, in the case of using the p-type substrate 130 in which an N-Well is implanted as in the first embodiment, it is also possible to produce the same effect by connecting the polysilicon layer 115a to Vcc and the polysilicon layer 115b to GND.

The semiconductor integrated device 1 according to the third embodiment of the present invention includes the interconnection layers 115 through 119; the shielded interconnection pattern 101; and the first shield interconnection pattern 102 and the second shield interconnection pattern 103 of different potentials around the shielded interconnection pattern 101, wherein the capacitance between the different polysilicon layers 115a and 115b is added between the shield interconnection patterns 102 and 103 of different potentials. As a result, according to the semiconductor integrated device 1, it is possible to reduce the effect of the signal of the shielded interconnection pattern 101 on the other signal line 104 or the effect of the other signal line 104 on the shielded interconnection pattern 101.

Fourth Embodiment

Figure 5:
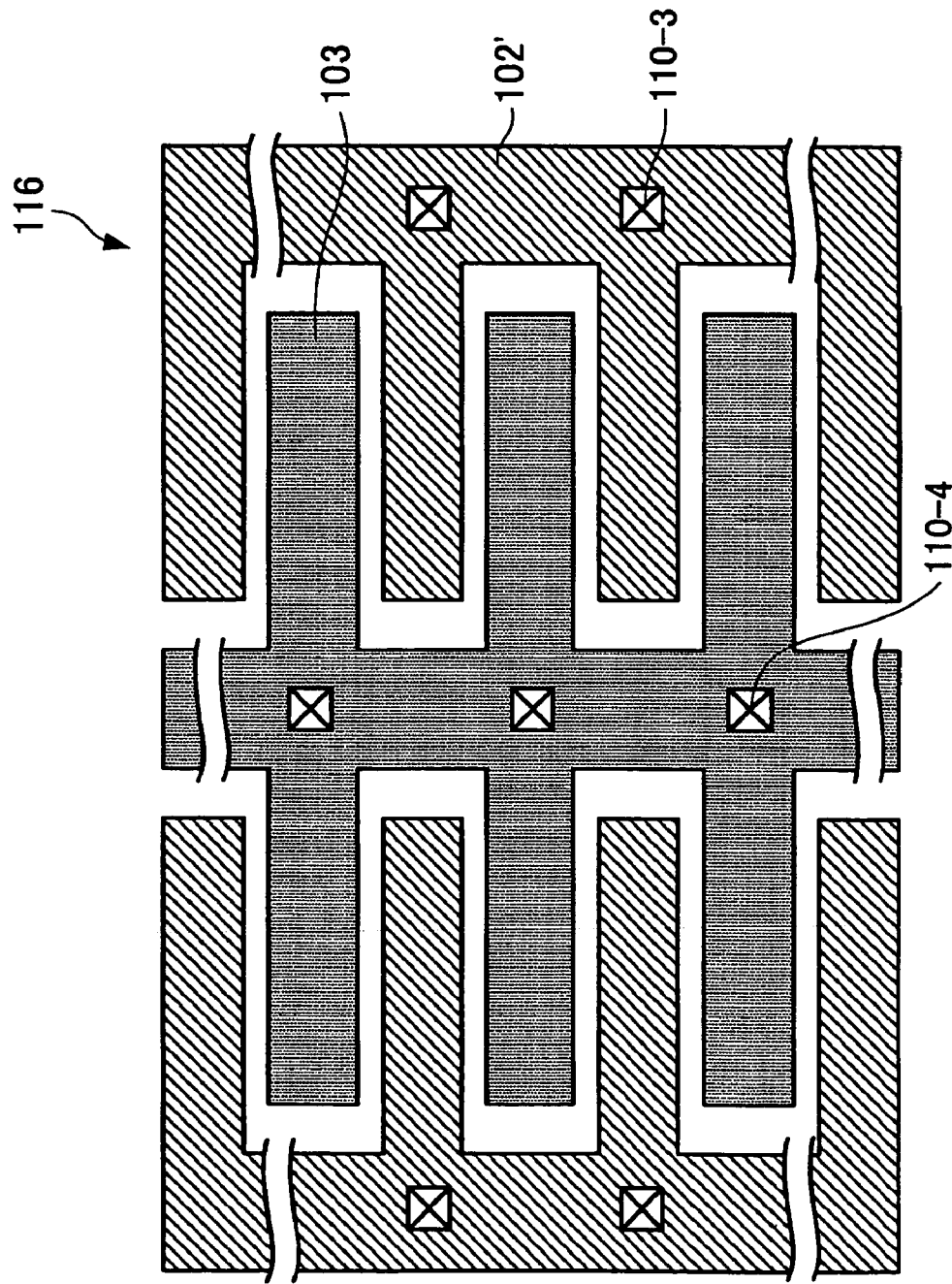
FIG. 5 is a plan view of part of the semiconductor integrated device, showing shield interconnection according to a fourth embodiment of the present invention.

Next, FIG. 5 is a diagram showing a layout configuration of the semiconductor integrated device 1 according to a fourth embodiment of the present invention, in which only a top plan view (a view from the interconnection layer 119 side to the substrate 130 side of FIG. 1) of the interconnection layer 116 is shown. According to this embodiment, shield interconnection patterns 102' (corresponding to the first shield interconnection pattern 102 of FIG. 1) and the shield interconnection pattern 103 having different potentials are combined to form part of the interconnection layer 116. In this embodiment, the same elements as those of the first embodiment are referred to by the same numerals, and a description thereof is omitted.

Referring to FIG. 5, the potential (GND) of the shield interconnection patterns 102' and the potential (Vcc) of the shield interconnection pattern 103 are different. Both shield interconnection patterns 102' and 103 are formed like a comb and provided in the interconnection layer 116 so that the projections and recesses of one of the shield interconnection patterns 102' and 103 correspond to the recesses and projections, respectively, of the other. That is, for example, the projections ("comb teeth") of the shield interconnection patterns 102' are arranged so as to alternate with the projections ("comb teeth") of the shield interconnection pattern 103. This arrangement may be referred to as "alternate comb arrangement." Further, contacts 110-3 connect the shield interconnection patterns 102' to the substrate 130 and contacts 110-4 connect the shield interconnection pattern 103 to the interconnection layer 115. The contacts (corresponding to the contacts 111) connecting the shield interconnection patterns 102' to the interconnection layer 117 may be provided either on top of the contacts 110-3 or in another region on the shield interconnection patterns 102'. Accordingly, a graphical illustration thereof is omitted. The shield interconnection patterns 102' are connected to the interconnection layer 117 through these graphically non-illustrated contacts, and further to the shield interconnection pattern 102 (provided in the interconnection layer 118) through the contacts 112. Here, both the shield interconnection pattern 102 and the shield interconnection patterns 102' are set to have the same potential (GND). By thus providing the shield interconnection patterns 102' and 103 in the interconnection layer 116, the interconnection layer 118 in which the shield interconnection pattern 102 is provided and the interconnection layer 116 in which the shield interconnection patterns 102' are provided function as a parallel plate capacitor with the shield interconnection patterns 102 and 102' serving as electrodes. As a result, as in the third embodiment where the capacitance between polysilicon layers is added, it is possible to add further capacitance to the capacitance between the shield interconnection patterns 102 and 103 shown in the first embodiment.

The semiconductor integrated device 1 according to the fourth embodiment of the present invention includes the interconnection layers 115 through 119; the shielded interconnection pattern 101; and the shield interconnection patterns 102, 102', and 103 of different potentials around the shielded interconnection pattern 101, wherein the shield interconnection patterns 102' and 103 of different potentials are disposed-in a comb-like manner in the same interconnection layer 116. As a result, it is possible to add the parasitic capacitance between the interconnection layers 116 and 118, so that it is possible to reduce the effect of the signal of the shielded interconnection pattern 101 on the other signal line 104 or the effect of the other signal line 104 on the shielded interconnection pattern 101.

Any two or more of the above-described second through fourth embodiments may be combined. In this case, it is possible to add any combination of different capacitances by the methods of providing shield interconnection shown in the second through fourth embodiments to shield interconnection patterns having different potentials. As a result, it is possible to reduce the effect of the signal of the shielded interconnection pattern 101 on the other signal line 104 or the effect of the other signal line 104 on the shielded interconnection pattern 101. A description is given below of configurations in which any two or more of the second through fourth embodiments are combined (as tenth and 11$^{th}$ embodiments)

Fifth Embodiment

Figure 6:
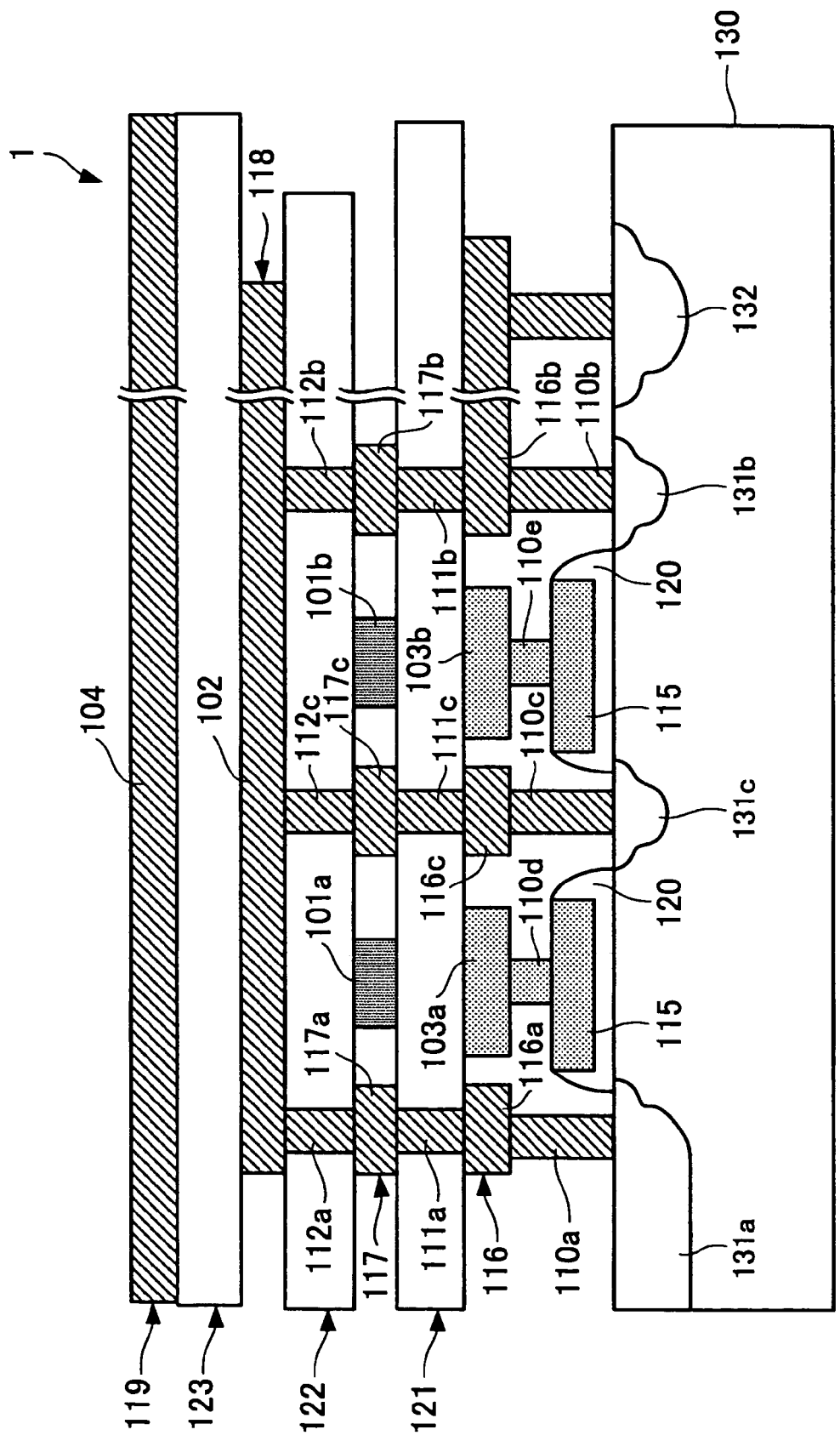
FIG. 6 is a cross-sectional view of the semiconductor integrated device, showing a configuration thereof according to a fifth embodiment of the present invention.

Next, FIG. 6 is a diagram showing a layout configuration of the semiconductor integrated device 1 according to a fifth embodiment of the present invention. According to this embodiment, multiple shielded interconnection patterns (corresponding to the shielded interconnection pattern 101) are provided. In this embodiment, the same elements as those of the first through fourth embodiments are referred to by the same numerals, and a description thereof is omitted.

Referring to FIG. 6, a shielded interconnection pattern (or an interconnection pattern to be shielded) 101a is provided between the first shield interconnection pattern 102 and a second shield interconnection pattern 103a, and a shielded interconnection pattern (or an interconnection pattern to be shielded) 101b is provided between the first shield interconnection pattern 102 and a second shield interconnection pattern 103b. Here, based on the method of providing shield interconnection shown in the first embodiment, the first shield interconnection pattern 102 provided in the interconnection layer 118 communicates with diffusions 131a, 131b, and 131c formed in the substrate 130 through contacts 112a, 112b, and 112c buried in the insulating film 122; the connection part 117a, the connection part 117b, and a connection part 117c of the interconnection layer 117; contacts 111a, 111b, and 111c buried in the insulating film 121; connection parts 116a, 116b, and 116c of the interconnection layer 116; and contacts 110a, 110b, and 110c. Further, the second shield interconnection pattern 103a provided independently in the interconnection layer 116 communicates with the diffusions 131a and 131c formed in the substrate 130 through a contact 110d, the interconnection layer 115, and the insulating film 120. The second shield interconnection pattern 103b, also provided independently in the interconnection layer 116, communicates with the diffusions 131b and 131c formed in the substrate 130 through a contact 110e, the interconnection layer 115, and the insulating film 120. The potential of the first shield interconnection pattern 102 is Vcc, and the potential of each of the second shield interconnection patterns 103a and 103b is GND. The method of providing shield interconnection to the substrate 130 may be realized by one or a combination of any two or more of the second through fourth embodiments.

This configuration reduces the effect of electric lines of force generated from the signals of the different shielded interconnection patterns 101a and 101b and electric lines of force generated from the signal of the other signal line 104 on the first shield interconnection pattern 102 and the second shield interconnection patterns 103a and 103b. Further, in order to reduce the effect between the shielded interconnection patterns 101a and 101b, the contacts 110c, 111c, and 112c, the connection part 117c of the interconnection layer 117, and the connection part 116c of the interconnection layer 116 are provided so as to separate the shielded interconnection patterns 101a and 101b by the first shield interconnection pattern 102. Further, in the case of adding one or more shielded interconnection patterns, it is also possible to reduce the effect between the shielded interconnection patterns by providing a second shield interconnection pattern for each of the added shielded interconnection pattern. Further, according to the method of providing shield interconnection according to this embodiment, the parasitic capacitance of the shielded interconnection patterns 101a and 101b has symmetry. Accordingly, it is possible to reduce the skew between signals.

According to the semiconductor integrated device 1 according to the fifth embodiment of the present invention, the shielded interconnection patterns 101a and 101b are separated by the shield interconnection patterns 102, 103a, and 103b of different potentials. As a result, it is possible to reduce the effect between the shielded interconnection patterns 101a and 101b. This is effective, in particular, for a high-frequency digital signal acting as a noise source for the other signal line 104, such as a multi-phase clock signal. Further, since the parasitic capacitance between the shielded interconnection patterns 101a and 101b is uniform, it is also possible to improve the skew between signals.

Sixth Embodiment

Figure 7:
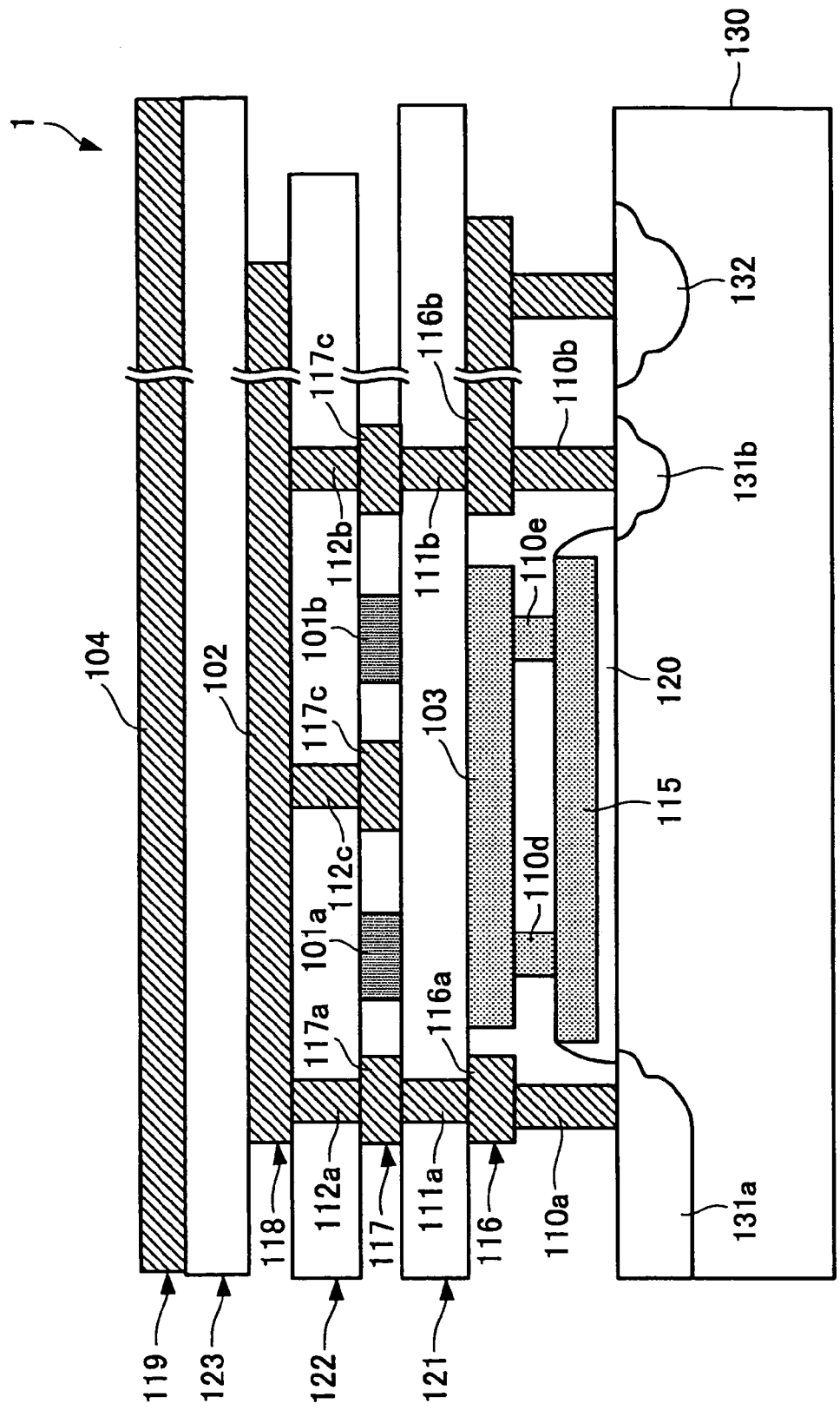
FIG. 7 is a cross-sectional view of the semiconductor integrated device, showing a configuration thereof according to a sixth embodiment of the present invention.

Next, FIG. 7 is a diagram showing a layout configuration of the semiconductor integrated device 1 according to a sixth embodiment of the present invention. According to this embodiment, the second shield interconnection patterns 103a and 103b opposing the shielded interconnection patterns 101a and 101b, respectively, shown in the fifth embodiment are shared, being combined into the single second interconnection pattern 103. In this embodiment, the same elements as those of the first through fifth embodiments are referred to by the same numerals, and a description thereof is omitted.

Referring to FIG. 7, the shielded interconnection patterns 101a and 101b are provided between the first shield interconnection pattern 102 and the second shield interconnection pattern 103. Here, in the case where there is no problem in the signal interference between the shielded interconnection patterns 101a and 101b exerting effects through the second shield interconnection patterns 103a and 103b of FIG. 6, the common second shield interconnection pattern 103 is provided so as to reduce the effect between the different shielded interconnection patterns 101a and 101b provided in the interconnection layer 117. The potential of the first shield interconnection pattern 102 and the potential of the second interconnection pattern 103 are Vcc and GND, respectively.

Further, the first shield interconnection pattern 102 provided in the interconnection layer 118 communicates from the interconnection layer 118 with the diffusion 131a formed in the substrate 130 through the contact 112a buried in the insulating film 122, the connection part 117a of the interconnection layer 117, the contact 111a buried in the insulating film 121, the connection part 116a of the interconnection layer 116, and the contact 110a. Further, the first shield interconnection pattern 102 communicates from the interconnection layer 118 with the interconnection layer 117 through the contact 112c buried in the insulating film 122 and the connection part 117c of the interconnection layer 117. Further, the first shield interconnection pattern 102 communicates from the interconnection layer 118 with the diffusion 131b formed in the substrate 130 through the contact 112b buried in the insulating film 122, the connection part 117b of the interconnection layer 117, the contact 111b buried in the insulating film 121, the connection part 116b of the interconnection layer 116, and the contact 110b.

Further, the second shield interconnection pattern 103 provided in the interconnection layer 116 communicates from the interconnection layer 116 with the diffusions 131a and 131b formed in the substrate 130 through the contacts 110d and 110e, the interconnection layer 115, and the insulating film 120.

According to the method of providing shield interconnection according to this embodiment, the area of the interconnection layer 115 increases compared with the case of applying the method of providing shield interconnection of the fifth embodiment. That is, it is possible to increase the capacitance between the shield interconnection patterns 102 and 103 according to the methods of providing shield interconnection of the second and third embodiments.

The semiconductor integrated device 1 according to the sixth embodiment of the present invention is useful, for example, when the effect of the noise of the shielded interconnection patterns 101a and 101b on interconnection patterns (including the signal line 104) other than the shield interconnection patterns is more important than the effect of the noise of the shielded interconnection patterns 101a and 101b on each other. In particular, it is possible to reduce the area of interconnection in the case of providing interconnection for multiple analog signals in which a change over time in signal voltage is relatively small.

Seventh Embodiment

Figure 8:
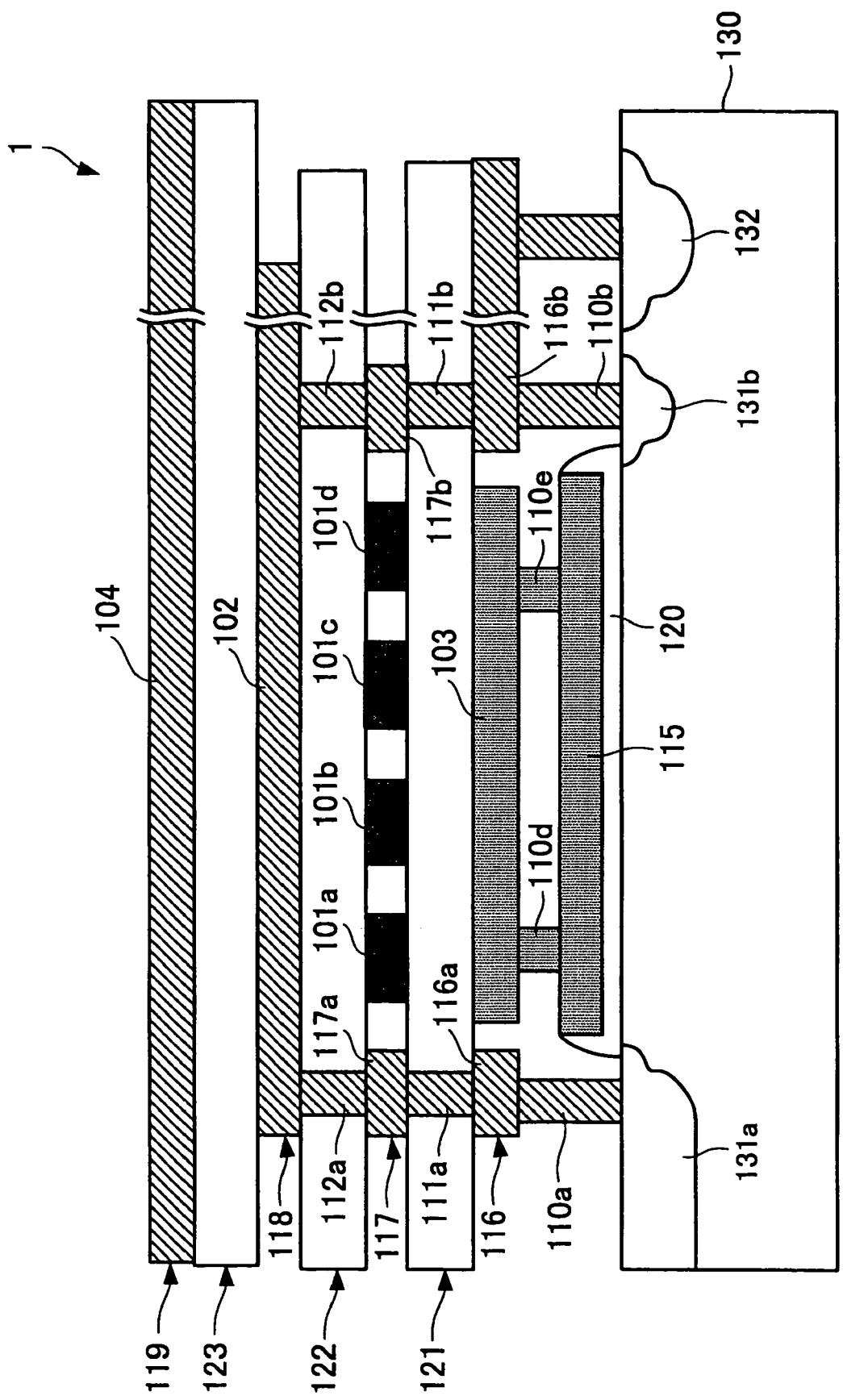
FIG. 8 is a cross-sectional view of the semiconductor integrated device, showing a configuration thereof according to a seventh embodiment of the present invention.

Next, FIG. 8 is a diagram showing a layout configuration of the semiconductor integrated device 1 according to a seventh embodiment of the present invention. The configuration of this embodiment corresponds to the configuration of the sixth embodiment from which the shield interconnection pattern disposed between the shielded interconnection patterns 101a and 101b (corresponding to the extension of the first shield interconnection pattern 102 from the interconnection layer 118 through the contact 112c to the interconnection layer 117 of FIG. 7) is omitted. In this embodiment, the same elements as those of the first through sixth embodiments are referred to by the same numerals, and a description thereof is omitted.

Referring to FIG. 8, four shielded interconnection patterns, namely, the shielded interconnection patterns 101a and 101b and shielded interconnection patterns 101c and 101d, are provided in the interconnection layer 117 whose size is the same as in the sixth embodiment. Here, compared with the sixth embodiment, the shielded interconnection patterns 101c and 101d are added by omitting the above-described extension of the first shield interconnection pattern 102. The method of providing shield interconnection according to this embodiment is useful, for example, in the case where the signal of each of the shielded interconnection patterns 101a through 101d is an analog signal whose voltage transition is small and it is desired to reduce the effect of the other signal line 104 on the shielded interconnection patterns 101a through 101d. Further, compared with the method of providing shield interconnection of the sixth embodiment, the area of the interconnection layer 115 increases. That is, it is possible to increase the capacitance between the shield interconnection patterns 102 and 103 according to the methods of providing shield interconnection of the second and third embodiments.

Eighth Embodiment

Figure 9:
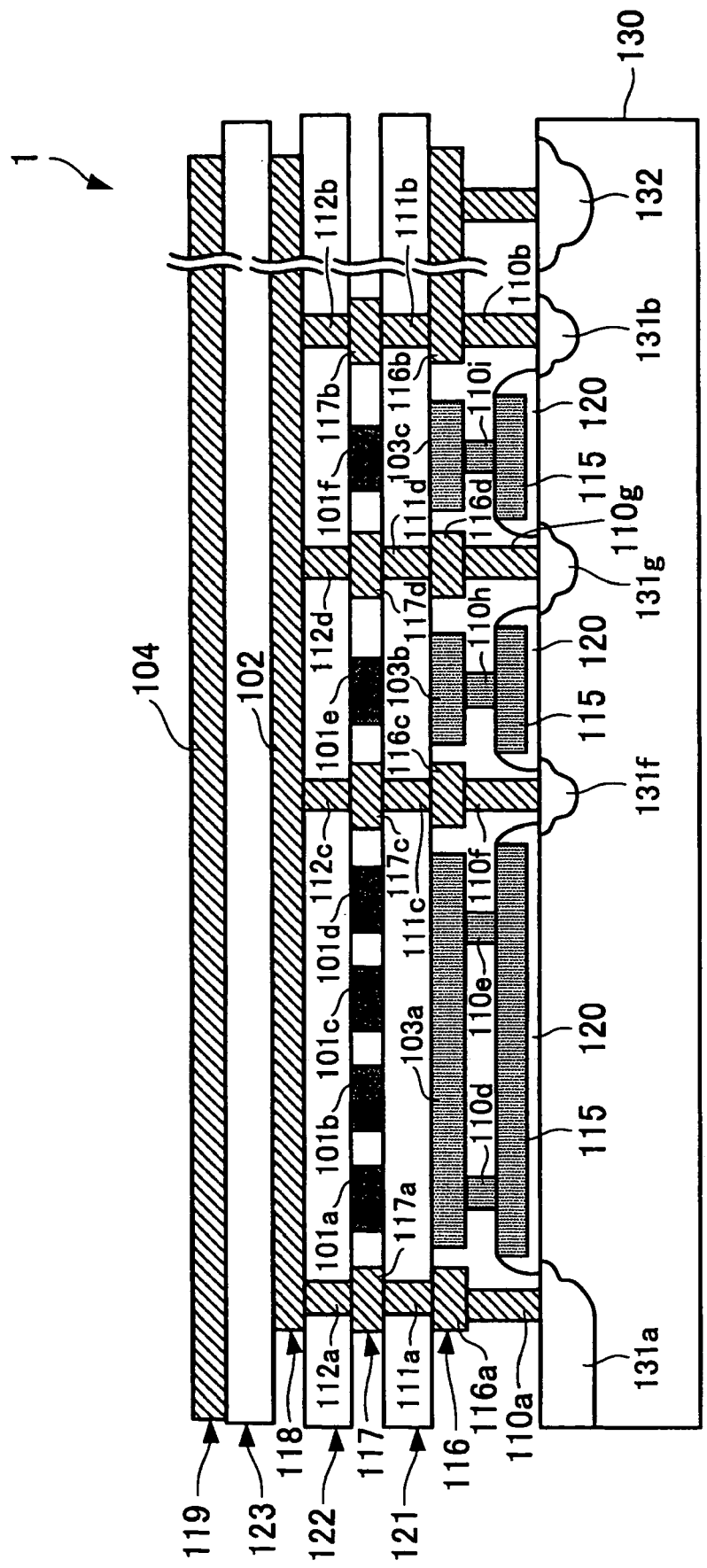
FIG. 9 is a cross-sectional view of the semiconductor integrated device, showing a configuration thereof according to an eighth embodiment of the present invention.

Next, FIG. 9 is a diagram showing a layout configuration of the semiconductor integrated device 1 according to an eighth embodiment of the present invention. According to this embodiment, multiple digital signal interconnection patterns and multiple analog signal interconnection patterns are separated by applying the method of providing shield interconnection shown in any of the first through seventh embodiments. In this embodiment, the same elements as those of the first through seventh embodiments are referred to by the same numerals, and a description thereof is omitted.

Referring to FIG. 9, each of the shielded interconnection patterns 101a, 101b, 101c, and 101d is formed of a signal line transmitting an analog signal, and each of shielded interconnection patterns 101e and 101f is formed of a signal line transmitting a digital signal. The common second shield interconnection pattern 103a is provided in order to shield the shielded interconnection patterns 101a, 101b, 101c, and 101d for an analog signal. The second shield interconnection pattern 103b and a second shield interconnection pattern 103c are provided in order to shield the shielded interconnection patterns 101e and 101f for digital signals.

Further, the first shield interconnection pattern 102 provided in the interconnection layer 118 communicates from the interconnection layer 118 with the diffusion 131a formed in the substrate 130 through the contact 112a buried in the insulating film 122, the connection part 117a of the interconnection layer 117, the contact 111a buried in the insulating film 121, the connection part 116a of the interconnection layer 116, and the contact 110a. Further, the first shield interconnection pattern 102 communicates from the interconnection layer 118 with the diffusion 131b formed in the substrate 130 through the contact 112b buried in the insulating film 122, the connection part 117b of the interconnection layer 117, the contact 111b buried in the insulating film 121, the connection part 116b of the interconnection layer 116, and the contact 110b. Further, the first shield interconnection pattern 102 communicates from the interconnection layer 118 with a diffusion 131f formed in the substrate 130 through the contact 112c buried in the insulating film 122, the connection part 117c of the interconnection layer 117, the contact 111c buried in the insulating film 121, the connection part 116c of the interconnection layer 116, and a contact 110f. Further, the first shield interconnection pattern 102 communicates from the interconnection layer 118 with a diffusion 131g formed in the substrate 130 through a contact 112d buried in the insulating film 122, a connection part 117d of the interconnection layer 117, a contact 111d buried in the insulating film 121, a connection part 116d of the interconnection layer 116, and a contact 110g.

Further, the second shield interconnection pattern 103a provided in the interconnection layer 116 communicates from the interconnection layer 116 with the diffusions 131a and 131f formed in the substrate 130 through the contacts 110d and 110e, the interconnection layer 115, and the insulating film 120. Further, the second shield interconnection pattern 103b provided in the interconnection layer 116 communicates from the interconnection layer 116 with the diffusions 131f and 131g formed in the substrate 130 through a contact 110h, the interconnection layer 115, and the insulating film 120. Further, the second shield interconnection pattern 103c provided in the interconnection layer 116 communicates from the interconnection layer 116 with the diffusions 131g and 131h formed in the substrate 130 through a contact 110i, the interconnection layer 115, and the insulating film 120.

Here, in order to deal with a digital signal of which voltage performs transition at high speed, the second shield interconnection patterns 103b and 103c are provided for the shielded interconnection patterns 101e and 101f, respectively, by applying the fifth embodiment, while the second shield interconnection pattern 103a common to the shielded interconnection patterns 101a through 101d is provided by applying the sixth or seventh embodiment in order to deal with an analog signal susceptible to noise. Thus, by dividing the second shield interconnection pattern in accordance with the types of signals (analog signal and digital signal) of the shielded interconnection patterns, it is possible to reduce signal interference by an analog signal, a high-frequency digital signal, and the other signal line 104.

According to the semiconductor integrated device 1 according to the eighth embodiment of the present invention, when the shielded interconnection patterns 101a through 101f transmit analog signals and high-frequency digital signals, it is possible to dispose the shielded interconnection patterns 101a through 101f in the same shield interconnection area 201 (FIG. 10) while reducing the effects of the analog and high-frequency digital signals, thus making it possible to reduce the area of interconnection. Further, it is also possible to reduce noise with respect to the other signal line 104 as well as the shield interconnection patterns 102 and 103a through 103c.

Ninth Embodiment

Figure 10:
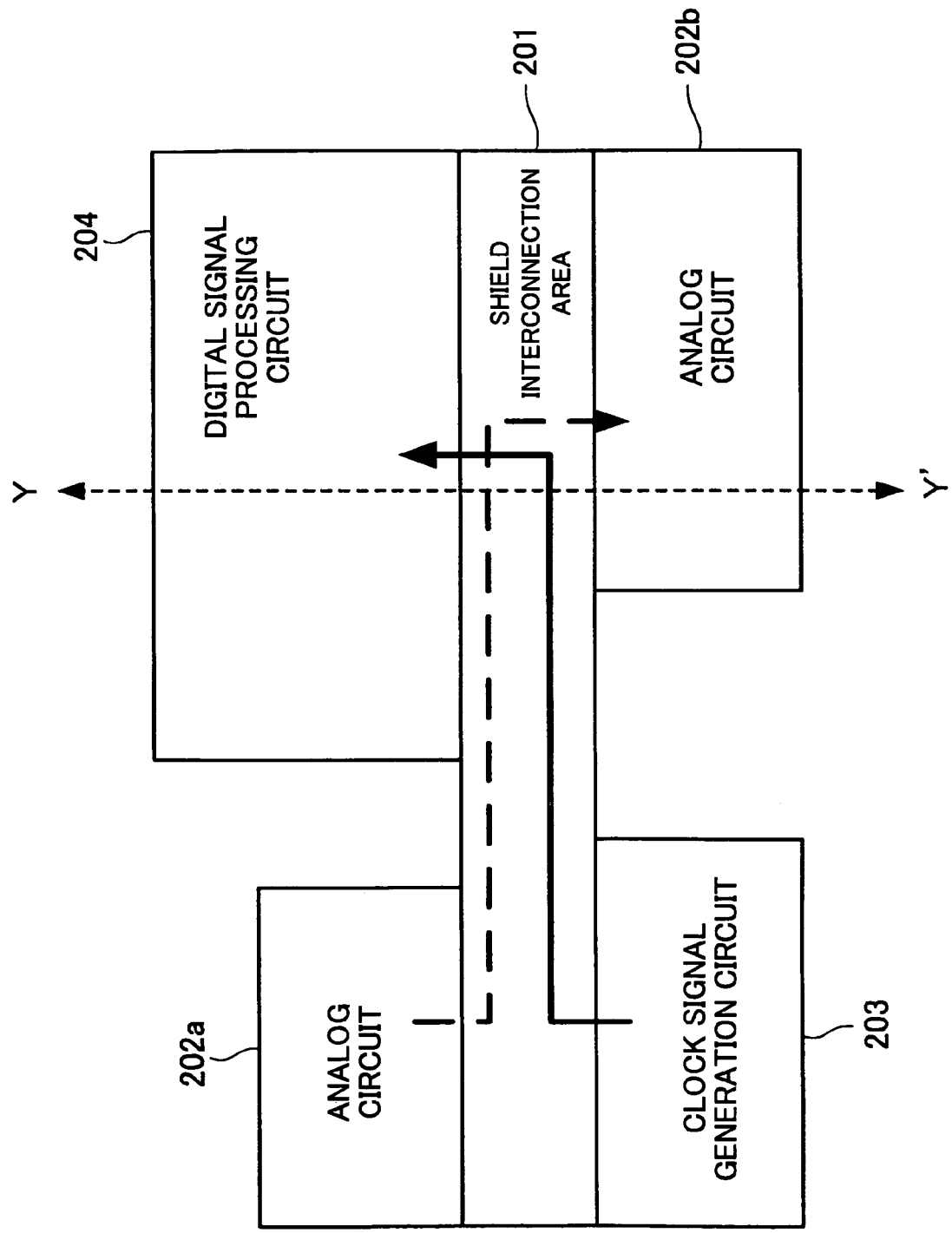
FIG. 10 is a diagram showing a layout of a semiconductor integrated device according to a ninth embodiment of the present invention.
Figure 11:
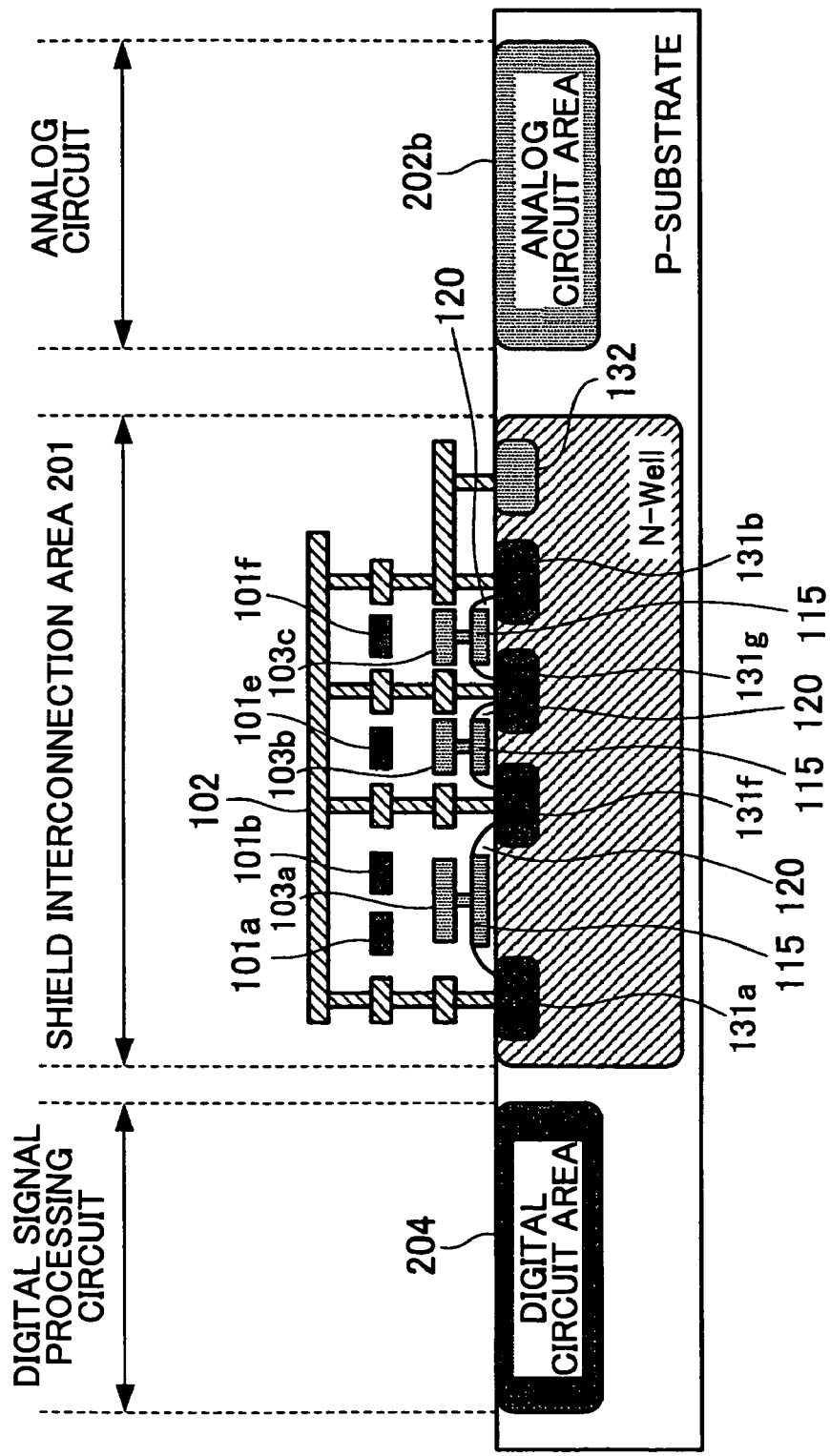
FIG. 11 is a cross-sectional view of the semiconductor device of FIG. 10 taken along the line Y-Y' according to the ninth embodiment of the present invention.

Next, FIG. 10 is a diagram showing a layout configuration of a semiconductor integrated device according to a ninth embodiment of the present invention. According to this embodiment, analog circuits 202a and 202b, a digital signal processing circuit 204, and a clock signal generation circuit 203 are mounted on a single chip. FIG. 11 is a cross-sectional view of the semiconductor integrated device 1 of FIG. 10 taken along the line Y-Y'. In this embodiment, the same elements as those of the first through eighth embodiments are referred to by the same numerals, and a description thereof is omitted.

Referring to FIG. 10, in the shield interconnection area 201, an analog signal line and a digital signal line may be provided by applying any one or more of the methods of providing shield interconnection shown in the first through eighth embodiments. An analog signal is transmitted between the two different analog circuits 202a and 202b through a shielded interconnection pattern (indicated by the broken line in FIG. 10) in the shield interconnection area 201. Further, the clock signal generation circuit 203 generates a multi-phase clock signal, and inputs the generated multi-phase clock signal to the digital signal processing circuit 204 through a shielded interconnection pattern (indicated by the solid line in FIG. 10) in the shield interconnection area 201.

More specifically, referring to FIG. 11, the shielded interconnection patterns 101a, 101b, 101e, and 101f are disposed in the shield interconnection area 201. An analog signal is transmitted through each of the shielded interconnection patterns 101a and 101b, which are shielded by the first shield interconnection pattern 102 and the second shield interconnection pattern 103a. Likewise, a multi-phase clock signal, which is a digital signal, is fed to the shielded interconnection patterns 101e and 101f, which are shielded individually by the first shield interconnection pattern 102 and the second shield interconnection patterns 103b and 103c. That is, in this embodiment, the digital signal interconnection patterns and the analog signal interconnection patterns are separated by applying the method of providing shield interconnection shown in the eighth embodiment (FIG. 9). Further, the substrate 130 is a p-type substrate. The first shield interconnection pattern 102 is connected to Vcc, and the second shield interconnection patterns 103a, 103b, and 103c are connected to GND (Vcc is a higher potential than GND). Further, the shield interconnection area 201 is disposed by applying the method of providing shield interconnection according to the first embodiment.

Further, referring to FIG. 11, each of the analog circuit 202b and the digital signal processing circuit 204 includes a CMOS transistor, and accordingly, includes a P-channel transistor and an N-channel transistor. Further, the shield interconnection area 201 is formed of P-channel transistors, which are disposed in the p-type substrate 130 in which an n-type impurity (N-Well) is implanted. Here, the N-Well layer formed in the substrate 130 reduces the noise through the substrate 130 between the analog circuit 202b and the digital signal processing circuit 204. Likewise, it is possible to reduce the noise through the substrate 130 between the clock signal generation circuit 203 and the analog circuit 202a provided across the shield interconnection area 201 from the clock signal generation circuit 203.

According to the semiconductor integrated device according to the ninth embodiment of the present invention, in which both analog and digital circuits are provided, the shield interconnection area 201 is provided between the digital signal processing circuit 204 and the analog circuit 202b and between the clock signal generation circuit 203 and the analog circuit 202a. As a result, it is possible to reduce the noise between digital and analog circuits through the substrate 130.

Tenth Embodiment

Figure 12:
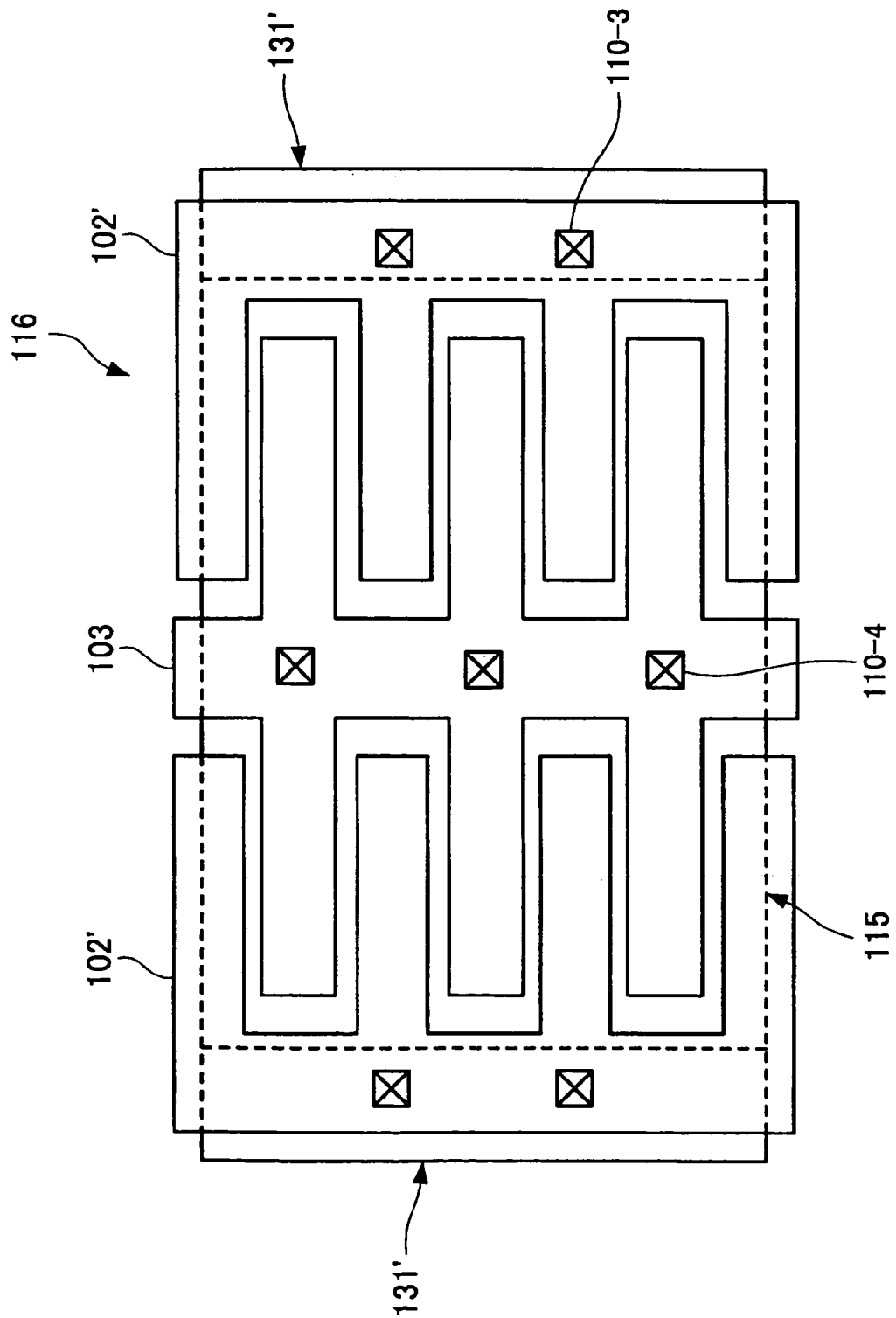
FIG. 12 is a plan view showing shield interconnection according to a tenth embodiment of the present invention.

Next, FIG. 12 is a diagram showing a layout configuration of the semiconductor integrated device 1 according to a tenth embodiment of the present invention. FIG. 12 is a top plan view (a view from the interconnection layer 119 side to the substrate 130 side of FIG. 1) of the interconnection layers 115 and 116 and the diffusions 131'. This configuration is a combination of the second embodiment of the fourth embodiment. In this embodiment, the same elements as those of the first through fourth embodiments are referred to by the same numerals, and a description thereof is omitted.

Referring to FIG. 12, the shield interconnection patterns 102' are connected to the diffusions 131' in the substrate 130 through the contacts 110-3. Here, the shield interconnection patterns 102' have the same potential as the first shield interconnection pattern 102 (FIG. 3) of the interconnection layer 118. Further, the second shield interconnection pattern 103 is connected to the insulating film (corresponding to a gate oxide film) 120 (FIG. 3) through the contacts 110-4. Here, the shield interconnection pattern 102' and the second shield interconnection pattern 103 are formed in the same interconnection layer 116. Accordingly, it is possible to provide the shield interconnection pattern 102' and the second shield interconnection pattern 103 in a comb-like manner by applying the fourth embodiment and form capacitance with interlayer insulators (for instance, the insulating films 121 and 122). Further, the shield interconnection pattern 102' and the second shield interconnection pattern 103 are connected respectively through the contacts 110-3 and 110-4 to the diffusions 131' and the insulating film (gate oxide film) 120 forming the gate capacitance of the second embodiment. As described above, it is possible to implement the second embodiment and the fourth embodiment simultaneously.

According to the semiconductor integrated device 1 according to the tenth embodiment, it is possible to add any combination of different capacitances to the shield interconnection patterns 102, 102', and 103 having different potentials by any one or more of the methods of providing shield interconnection shown in the first through fourth embodiments. This configuration makes it possible to reduce the effect of the signal of the shielded interconnection pattern 101 on the other signal line 104 or the effect of the other signal line 104 on the shielded interconnection pattern 101.

11$^{th}$ Embodiment

Figure 13:
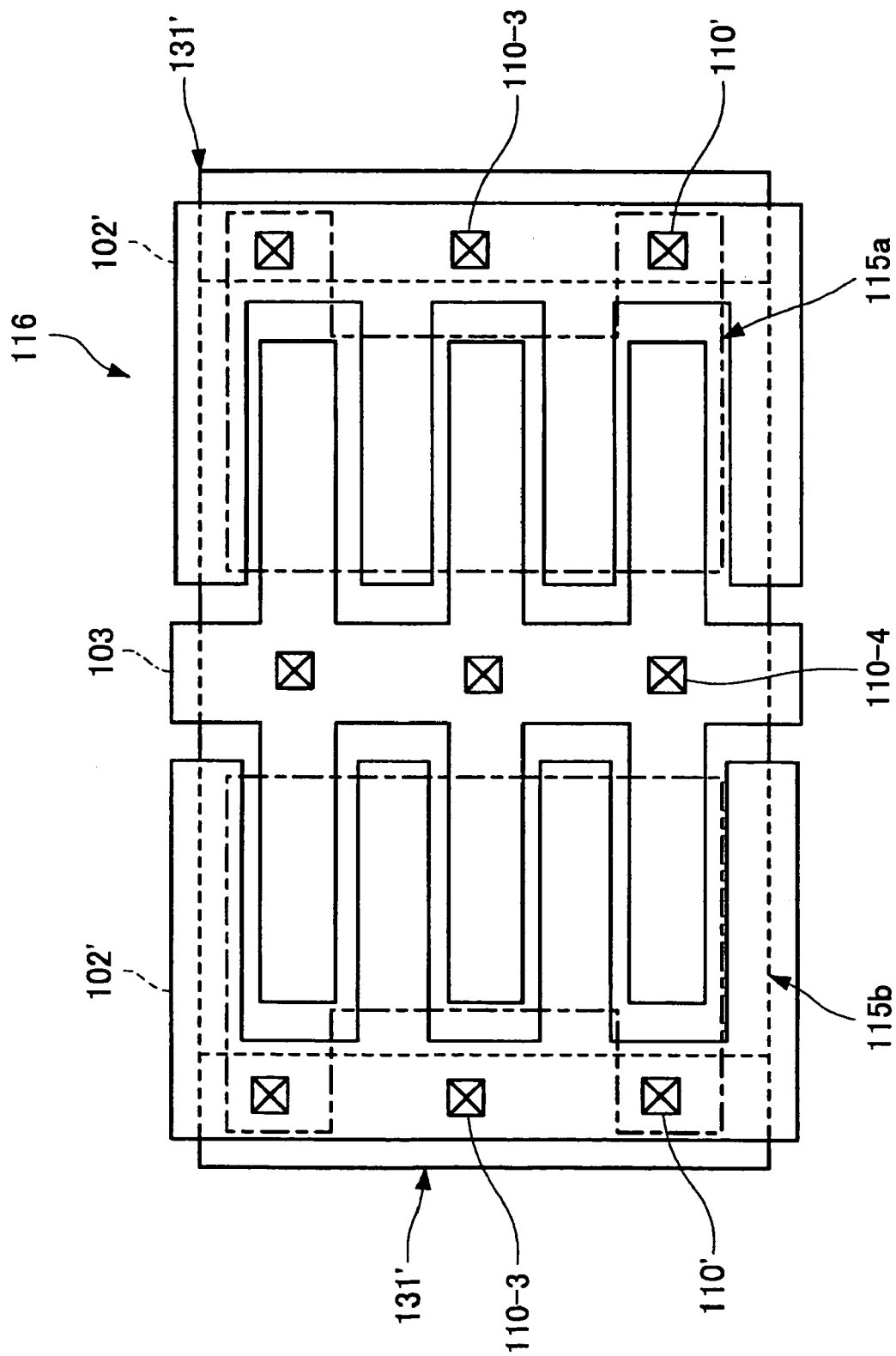
FIG. 13 is a plan view showing shield interconnection according to an $11^{th}$ embodiment of the present invention.

Next, FIG. 13 is a diagram showing a layout configuration of the semiconductor integrated device 1 according to an 11$^{th}$ embodiment of the present invention. FIG. 13 is a top plan view (a view from the interconnection layer 119 side to the substrate 130 side of FIG. 1) of the polysilicon layers 115a and 115b, the interconnection layer 116, and the diffusions 131'. This is a combination of the third embodiment and the fourth embodiment. In this embodiment, the same elements as those of the first through fourth embodiments are referred to by the same numerals, and a description thereof is omitted.

Referring to FIG. 13, the second shield interconnection pattern 103 is connected to the polysilicon layer 115b through the contacts 110-4. The shield interconnection patterns 102' are connected to the diffusions 131' in the substrate 130 through the contacts 110-3 and to the polysilicon layer 115a (stacked above the polysilicon layer 115b) through contacts 110'. The shield interconnection pattern 102' has the same potential as the first interconnection pattern 102 (FIG. 4) of the interconnection layer 118. As described above, it is possible to implement the methods of providing shield interconnection of the third embodiment and the fourth embodiment simultaneously in combination. Further, it is also possible to select a desired capacitance between the first shield interconnection pattern 102 and the second shield interconnection pattern 103 by selecting a suitable number of polysilicon layers and stacking them in the semiconductor integrated device 1.

According to the semiconductor integrated device 1 according to the 11$^{th}$ embodiment, it is possible to add any combination of different capacitances to the shield interconnection patterns 102, 102', and 103 having different potentials by any one or more of the methods of providing shield interconnection shown in the first through fourth embodiments. This configuration makes it possible to reduce the effect of the signal of the shielded interconnection pattern 101 on the other signal line 104 or the effect of the other signal line 104 on the shielded interconnection pattern 101.

A brief description is given below of conventional semiconductor integrated devices for purposes of comparison. For example, Japanese Laid-Open Patent Application No. 2000-150802 discloses a semiconductor integrated circuit in which a shield interconnection pattern connected to analog ground is formed around an analog signal pad (corresponding to an analog circuit), and the shield interconnection pattern is provided in a topmost interconnection layer, an intermediate interconnection layer, and a through layer connecting the topmost interconnection layer and the intermediate interconnection layer so as to surround the analog signal pad from the topmost interconnection layer to the intermediate interconnection layer. Further, Japanese Laid-Open Patent Application No. 2000-58752 discloses a semiconductor device having an oscillation circuit in which configuration the oscillation circuit is separated from other circuits, a shield area (for example, an n+ shield area) is provided around the oscillation circuit, and a shield interconnection pattern is formed on the shield area through a shield electrode. Further, Japanese Laid-Open Patent Application No. 2000-269211 discloses a semiconductor device in which a signal interconnection pattern and two adjacent interconnection patterns parallel thereto are formed in the same layer, a cross interconnection pattern is formed in each of upper and lower interconnection layers provided above and below the layer with an insulating layer between the layer and each of the upper and lower interconnection layers, through holes (corresponding to contacts) for connecting the cross interconnection patterns and the two adjacent interconnection patterns are formed between the cross interconnection patterns and the two adjacent interconnection patterns. Further, Japanese Laid-Open Patent Application No. 2000-353785 discloses a semiconductor device in which a second interconnection pattern and a third interconnection pattern are formed on the right side and the left side, respectively, of a first interconnection pattern connecting a reference voltage generation circuit (for example, a circuit for generating a reference voltage for driving an analog circuit) and a drive circuit outputting internal voltage (corresponding to an analog circuit), a shield line is formed below the first, second, and third interconnection patterns through an insulating layer, and the shield line is set to a ground potential. Further, Japanese Laid-Open Patent Application No. 2001-44305 discloses a semiconductor device in which a ground pattern is formed around a semiconductor element mounted on one surface of a substrate, and the four sides of the ground pattern are connected by metal wires provided in a lattice-like manner so as to cover the semiconductor element. Further, Japanese Laid-Open Patent Application No. 2001-144091 discloses a semiconductor integrated circuit in which an analog signal line and a digital signal line are provided in the same layer with a first shield line (for example, a power supply line) being provided between the analog and digital signal lines, a second shield line (for example, a power supply line) is provided above the analog signal line and the first shield line, and a contact wall for shielding is formed over the entire shield area between the first and second shield lines.

However, none of the above-described publications includes a specific disclosure of, for example, (a) reducing noise mixed into an analog signal line or other signal lines by a digital signal and making the parasitic capacitance of a shield interconnection pattern uniform by disposing at least two shield interconnection patterns having different potentials around the analog signal interconnection pattern or a digital signal interconnection pattern and adding capacitance between the shield interconnection patterns having different potentials in order to reduce variations in the potentials of the shield interconnection patterns due to a signal line having a high driving capability, such as one for a multi-phase clock signal, as shown in the first through $11^{th}$ embodiments of the present invention; and (b) stabilizing actual operations and increasing reliability by reducing the noise through a substrate between a digital signal processing circuit part and an analog circuit part by disposing, between the digital signal processing circuit and the analog circuit, a shield interconnection area using one or more methods of providing shield interconnection according to embodiments of the present invention including the first embodiment. Thus, the devices and methods disclosed in the above-described publications are different in configuration and effect (operation) from the present invention.

According to one aspect of the present invention, there is provided a first method of providing shield interconnection, the method shielding an interconnection pattern to be shielded with shield interconnection patterns for shielding on the substrate of a semiconductor integrated device, the method including the steps of: disposing multiple interconnection layers having the corresponding shield interconnection patterns formed therein so that the interconnection layers surround the interconnection pattern to be shielded; setting different potentials for at least a first one of the shield interconnection patterns formed in a first one of the interconnection layers and a second one of the shield interconnection patterns formed in a second one of the interconnection layers; and shielding the interconnection pattern to be shielded with the first one and the second one of the shield interconnection patterns.

This configuration may correspond to the first embodiment, wherein the interconnection layer 118 or the interconnection layer 116 may correspond to the first one of the interconnection layers or the second one of the interconnection layers; and Vcc or GND may correspond to the potential of the first one of the shield interconnection patterns (the first potential) or the potential of the second one of the shield interconnection patterns (the second potential).

Additionally, in the first method, the first one of the shield interconnection patterns may be connected to a diffusion formed in the substrate, and the second one of the shield interconnection patterns may be connected to a polysilicon layer in contact with the diffusion through a gate oxide film, so that a coupling capacitance between the polysilicon layer and the gate oxide film and the substrate is added.

This configuration may correspond to the second embodiment, wherein the interconnection layer 115 formed of polysilicon may correspond to the polysilicon layer.

Additionally, in the first method, the second one of the shield interconnection patterns may be connected to a first polysilicon layer in contact with a diffusion formed in the substrate through a first gate oxide film, and the first one of the shield interconnection patterns may be connected to the diffusion and to a second polysilicon layer in contact with the first polysilicon layer through a second gate oxide film, so that the parasitic capacitance between the first polysilicon layer and the second polysilicon layer is added.

This configuration may correspond to the third embodiment, wherein the polysilicon layer 115*a* may correspond to the second polysilicon layer, the polysilicon layer 115*b* may correspond to the first polysilicon layer, the insulating layer (gate oxide film) 120*a* may correspond to the second gate oxide film, and the insulating layer (gate oxide film) 120*b* may correspond to the first gate oxide film.

Additionally, in the first method, the first one and the second one of the shield interconnection patterns may be provided in combination in an alternate comb arrangement in the second one of the interconnection layers, so that the parasitic capacitance between the first one and the second one of the interconnection layers is added.

This configuration may correspond to the fourth embodiment, wherein the interconnection layer 116 may correspond to the second one of the interconnection layers, and the shield interconnection patterns 102' may correspond to the first one of the shield interconnection patterns.

Additionally, in the first method, the first one of the shield interconnection patterns may be connected to a diffusion formed in the substrate, and the second one of the shield interconnection patterns may be connected to a polysilicon layer in contact with the diffusion through a gate oxide film, so that the coupling capacitance between the polysilicon layer and the gate oxide film and the substrate is added; and the first one and the second one of the shield interconnection patterns may be provided in combination in an alternate comb arrangement in the second one of the interconnection layers, so that the parasitic capacitance between the first one and the second one of the interconnection layers is added.

This configuration may correspond to the tenth embodiment.

Additionally, in the first method, the second one of the shield interconnection patterns may be connected to a first polysilicon layer in contact with a diffusion formed in the substrate through a first gate oxide film, and the first one of the shield interconnection patterns may be connected to the diffusion and to a second polysilicon layer in contact with the first polysilicon layer through a second gate oxide film, so that the parasitic capacitance between the first polysilicon layer and the second polysilicon layer is added; and the first one and the second one of the shield interconnection patterns may be provided in combination in an alternate comb arrangement in the second one of the interconnection layers, so that the parasitic capacitance between the first one and the second one of the interconnection layers is added.

This configuration may correspond to the $11^{th}$ embodiment.

Additionally, in the first method, in the case of shielding multiple interconnection patterns to be shielded, each of the first one and the second one of the interconnection layers may be disposed in multiple parts so that the first one and the second one of the interconnection layers surround each interconnection pattern to be shielded separately.

This configuration may correspond to the fifth embodiment, wherein the interconnection layer 118 may correspond to the first one of the interconnection layers; the interconnection layer 116 may correspond to the second one of the interconnection layers; the shielded interconnection patterns 101a and 101b may correspond to the multiple interconnection patterns to be shielded; the first shield interconnection pattern 102 may correspond to the first one of the shield interconnection patterns; and the second shield interconnection pattern 103a and 103b may correspond to the second one of the shield interconnection patterns.

Additionally, in the first method, in the case where the multiple interconnection patterns to be shielded include an interconnection pattern to be shielded for an analog signal and an interconnection pattern to be shielded for a digital signal, the interconnection pattern to be shielded for the analog signal and the interconnection pattern to be shielded for the digital signal may be shielded separately.

This configuration may correspond to the eighth embodiment, wherein the shielded interconnection patterns 101a through 101d may correspond to the interconnection pattern to be shielded for an analog signal, and the shielded interconnection patterns 101e and 101f may correspond to the interconnection pattern to be shielded for a digital signal.

Additionally, in the first method, in the case of shielding multiple interconnection patterns to be shielded, each of the first one and the second one of the interconnection layers may be disposed so as to be common to the multiple interconnection patterns to be shielded so that the first one and the second one of the interconnection layers surround the multiple interconnection patterns to be shielded.

This configuration may correspond to the sixth and seventh embodiments, wherein the interconnection layers 118 and 116 may correspond respectively to the first one and the second one of the interconnection layers common to the multiple shielded interconnection patterns.

According to one aspect of the present invention, there is provided a second method of providing shield interconnection, the method shielding multiple interconnection patterns to be shielded with shield interconnection patterns for shielding on a substrate of a semiconductor integrated device having an analog circuit and a digital signal processing circuit mounted on a single chip, wherein: the interconnection patterns to be shielded include an interconnection pattern to be shielded for an analog signal and an interconnection pattern to be shielded for a digital signal; a shield interconnection area in which the interconnection pattern to be shielded for the analog signal and the interconnection pattern to be shielded for the digital signal are disposed is provided on the substrate so as to separate the analog circuit and the digital signal processing circuit from each other; and the interconnection pattern to be shielded for the analog signal and the interconnection pattern to be shielded for the digital signal in the shield interconnection area are shielded separately by the above-described first method.

This configuration may correspond to the ninth embodiment.

According to one aspect of the present invention, a first semiconductor integrated device is provided that includes: an interconnection pattern to be shielded; and multiple interconnection layers having respective shield interconnection patterns formed therein, wherein a first one of the shield interconnection patterns is formed in a first one of the interconnection layers, and a second one of the shield interconnection patterns is formed in a second one of the interconnection layers; and the shield interconnection patterns for shielding and the interconnection pattern to be shielded are provided on a same substrate by the above-described first method.

This configuration may correspond to the first through ninth embodiments.

Additionally, the first semiconductor integrated device may further include: a diffusion formed in the substrate; a gate oxide film in contact with the diffusion; and a polysilicon layer formed on the gate oxide film, wherein the first one of the shield interconnection layers may be connected to the diffusion, and the second one of the shield interconnection patterns may be connected to the polysilicon layer, so that the coupling capacitance between the polysilicon layer and the gate oxide film and the substrate is added.

This configuration may correspond to the second embodiment.

Additionally, the first semiconductor integrated device may further include: a diffusion formed in the substrate; a first gate oxide film in contact with the diffusion; a first polysilicon layer formed on the first gate oxide film; a second gate oxide film formed on the first polysilicon layer; and a second polysilicon layer formed on the second gate oxide film, wherein the second one of the shield interconnection patterns may be connected to the first polysilicon layer, and the first one of the shield interconnection patterns may be connected to the diffusion and the second polysilicon layer, so that the parasitic capacitance between the first polysilicon layer and the second polysilicon layer is added.

This configuration may correspond to the third embodiment.

Additionally, in the first semiconductor integrated device, the first one and the second one of the shield interconnection patterns may be provided in combination in an alternate comb arrangement in the second one of the interconnection layers, so that the parasitic capacitance between the first one and the second one of the interconnection layers is added.

This configuration may correspond to the fourth embodiment.

Additionally, in the first semiconductor integrated device the interconnection pattern to be shielded may include a first interconnection pattern to be shielded for an analog signal and a second interconnection pattern to be shielded for a digital signal.

This configuration may correspond to the eighth embodiment.

According to one aspect of the present invention, a second semiconductor integrated device is provided that includes: a first interconnection layer in which a first shield interconnection pattern fixed to a first potential is provided; a second interconnection layer in which a second shield interconnection pattern fixed to a second potential is provided; a third interconnection layer in which an interconnection pattern to be shielded is provided; and a connection part configured to connect the first, second, and third interconnection layers, the first, second, and third interconnection layers being on the substrate of the semiconductor integrated device, wherein the third interconnection layer is provided between the first interconnection layer and the second interconnection layer; the connection part is connected to the first shield interconnection pattern so as to communicate from the first interconnection layer with the second interconnection layer through the third interconnection layer with the interconnection pattern to be shielded being provided between first and second parts of the connection part; and the first shield interconnection pattern, the connection part connected thereto, and the second shield interconnection pattern surround and shield the interconnection pattern to be shielded.

This configuration may correspond to the first embodiment, wherein the interconnection layer 118 or the interconnection layer 116 may correspond to the first interconnection layer or the second interconnection layer; Vcc or GND may correspond to the potential of the first shield interconnection pattern (the first potential) or the second shield interconnection pattern (the second potential); the interconnection layer 117 may correspond to the third interconnection layer; and the contacts 110-1, 111, and 112, the connection parts 117a and 117b, and the connection parts 116-1 of the interconnection layer 116 may correspond to the connection part.

According to one aspect of the present invention, a third semiconductor integrated device is provided that includes: a first interconnection layer in which a first shield interconnection pattern fixed to a first potential is provided; a second interconnection layer in which a second shield interconnection pattern fixed to a second potential is provided; a third interconnection layer in which a third shield interconnection pattern fixed to the second potential is provided, the third interconnection layer being separated from the second interconnection layer; a fourth interconnection layer in which a first interconnection pattern to be shielded is provided; a fifth interconnection layer in which a second interconnection pattern to be shielded is provided, the fifth interconnection layer being separated from the fourth interconnection layer; a first connection part configured to connect the first, second, and fourth interconnection layers; and a second connection part configured to connect the first, third, and fifth interconnection layers, the first, second, third, fourth, and fifth interconnection layers and the first and second connection parts being on the substrate of the semiconductor integrated device, wherein the fourth interconnection layer is provided between the first interconnection layer and the second interconnection layer, and the first connection part connected to the first shield interconnection pattern communicates from the first interconnection layer with the second interconnection layer through the fourth interconnection layer with the first interconnection pattern to be shielded being provided between first and second parts of the first connection part, so that the first shield interconnection pattern, the first connection part connected thereto, and the second shield interconnection pattern surround the first interconnection pattern to be shielded; and the fifth interconnection layer is provided between the first interconnection layer and the third interconnection layer, and the second connection part connected to the first shield interconnection pattern communicates from the first interconnection layer with the third interconnection layer through the fifth interconnection layer with the second interconnection pattern to be shielded being provided between first and second parts of the second connection part, so that the first shield interconnection pattern, the second connection part connected thereto, and the third shield interconnection pattern surround the second interconnection pattern to be shielded; thereby shielding the first interconnection pattern to be shielded and the second interconnection pattern to be shielded separately.

This configuration may correspond to the fifth embodiment, wherein the interconnection layer 118 may correspond to the first interconnection layer; the interconnection layer 116 may correspond to the second and third interconnection layers; the interconnection layer 117 may correspond to the fourth and fifth interconnection layers; the shielded interconnection pattern 101a may correspond to the first interconnection pattern to be shielded; the shielded interconnection pattern 101b may correspond to the second interconnection pattern to be shielded; the first shield interconnection pattern 102 may correspond to the first shield interconnection pattern; the second shield interconnection pattern 103a may correspond to the second shield interconnection pattern; the second shield interconnection pattern 103b may correspond to the third shield interconnection pattern; the contacts 110a, 110c, 111a, 111c, 112a, and 112c and the connection parts 116a, 116c, 117a, and 117c may correspond to the first connection part; and the contacts 110b, 110c, 111b, 111c, 112b, and 112c and the connection parts 116b, 116c, 117b, and 117c may correspond to the second connection part.

Additionally, in the third semiconductor integrated device, one of the first and second interconnection patterns to be shielded may be for an analog signal, and another one of the first and second interconnection patterns to be shielded may be for a digital signal.

This configuration may correspond to the eighth embodiment.

According to one aspect of the present invention, a fourth semiconductor integrated device is provided that includes: a first interconnection layer in which a first shield interconnection pattern fixed to a first potential is provided; a second interconnection layer in which a second shield interconnection pattern fixed to a second potential is provided; a third interconnection layer in which a first interconnection pattern to be shielded is provided; a fourth interconnection layer in which a second interconnection pattern to be shielded is provided, the fourth interconnection layer being separated from the third interconnection layer; a first connection part configured to connect the first, second, and third interconnection layers; a second connection part configured to connect the first, second, and fourth interconnection layers; and a third connection part configured to connect the first, third, and fourth interconnection layers, the first, second, third, and fourth interconnection layers and the first, second, and third connection parts being on the substrate of the semiconductor integrated device, wherein the third and fourth interconnection layers are provided between the first interconnection layer and the second interconnection layer, the first connection part connected to the first shield interconnection pattern communicates from the first interconnection layer with the second interconnection layer through the third interconnection layer while opposing the first interconnection pattern to be shielded, the second connection part connected to the first shield interconnection pattern communicates from the first interconnection layer with the second interconnection layer through the fourth interconnection layer while opposing the second interconnection pattern to be shielded, and the third connection part connected to the first shield interconnection pattern passes between the first and second interconnection patterns to be shielded so as to communicate from the first interconnection layer with the third and fourth interconnection layers, so that the first shield interconnection pattern, the first and third connection parts connected thereto, and the second shield interconnection pattern surround the first interconnection pattern to be shielded, and the first shield interconnection pattern, the second and third connection parts connected thereto, and the second shield interconnection pattern surround the second interconnection pattern to be shielded, thereby shielding the first and second interconnection patterns to be shielded with the second shield interconnection pattern being shared between the first and second interconnection patterns to be shielded.

This configuration may correspond to the sixth embodiment.

According to one aspect of the present invention, a fifth semiconductor integrated device is provided that includes: an analog circuit and a digital signal processing circuit mounted on a single chip; and a shield interconnection area in which an interconnection pattern to be shielded for an analog signal and an interconnection pattern to be shielded for a digital signal are disposed, the shield interconnection area separating the analog circuit and the digital signal processing circuit from each other, wherein the shield interconnection area has a configuration of the above-described fourth semiconductor integrated device so that the interconnection pattern to be shielded for the analog signal and the interconnection pattern to be shielded for the digital signal in the shield interconnection area are shielded separately.

This configuration may correspond to the ninth embodiment.

The present invention is not limited to the specifically disclosed embodiments, and variations and modifications may be made without departing from the scope of the present invention.

The present application is based on Japanese Priority Patent Application No. 2005-026600, filed on Feb. 2, 2005, the entire contents of which are hereby incorporated by reference.

What is claimed is:

1. A semiconductor integrated device comprising:
an interconnection pattern to be shielded;
a plurality of interconnection layers having respective shield interconnection patterns formed therein;
a diffusion formed in the substrate;
a first gate oxide film in contact with the diffusion;
a first polysilicon layer formed on the first gate oxide film;
a second gate oxide film formed on the first polysilicon layer; and
a second polysilicon layer formed on the second gate oxide film,
wherein a first one of the shield interconnection patterns is formed in a first one of the interconnection layers, and a second one of the shield interconnection patterns is formed in a second one of the interconnection layers, and
wherein the second one of the shield interconnection patterns is connected to the first polysilicon layer, and the first one of the shield interconnection patterns is connected to the diffusion and the second polysilicon layer, so that a parasitic capacitance between the first polysilicon layer and the second polysilicon layer is added.

2. A semiconductor integrated device comprising:
an interconnection pattern to be shielded; and
a plurality of interconnection layers having respective shield interconnection patterns formed therein,
wherein a first one of the shield interconnection patterns is formed in a first one of the interconnection layers, and a second one of the shield interconnection patterns is formed in a second one of the interconnection layers, and
wherein the first one and the second one of the shield interconnection patterns are provided in combination in an alternate comb arrangement in the second one of the interconnection layers, so that a parasitic capacitance between the first one and the second one of the interconnection layers is added.

3. The semiconductor integrated device as claimed in claim 2, wherein the interconnection pattern to be shielded comprises a first interconnection pattern to be shielded for an analog signal and a second interconnection pattern to be shielded for a digital signal.

4. A semiconductor integrated device, comprising:
a first interconnection layer in which a first shield interconnection pattern fixed to a first potential is provided;
a second interconnection layer in which a second shield interconnection pattern fixed to a second potential is provided;
a third interconnection layer in which a third shield interconnection pattern fixed to the second potential is provided, the third interconnection layer being separated from the second interconnection layer;
a fourth interconnection layer in which a first interconnection pattern to be shielded is provided;
a fifth interconnection layer in which a second interconnection pattern to be shielded is provided, the fifth interconnection layer being separated from the fourth interconnection layer;
a first connection part configured to connect the first, second, and fourth interconnection layers; and
a second connection part configured to connect the first, third, and fifth interconnection layers, the first, second, third, fourth, and fifth interconnection layers and the first and second connection parts being on a substrate of the semiconductor integrated device,
wherein the fourth interconnection layer is provided between the first interconnection layer and the second interconnection layer, and the first connection part connected to the first shield interconnection pattern communicates from the first interconnection layer with the second interconnection layer through the fourth interconnection layer with the first interconnection pattern to be shielded being provided between first and second parts of the first connection part, so that the first shield interconnection pattern, the first connection part connected thereto, and the second shield interconnection pattern surround the first interconnection pattern to be shielded; and the fifth interconnection layer is provided between the first interconnection layer and the third interconnection layer, and the second connection part connected to the first shield interconnection pattern communicates from the first interconnection layer with the third interconnection layer through the fifth interconnection layer with the second interconnection pattern to be shielded being provided between first and second parts of the second connection part, so that the first shield interconnection pattern, the second connection part connected thereto, and the third shield interconnection pattern surround the second interconnection pattern to be shielded; thereby shielding the first interconnection pattern to be shielded and the second interconnection pattern to be shielded separately.

5. A semiconductor integrated device, comprising:
a first interconnection layer in which a first shield interconnection pattern fixed to a first potential is provided;
a second interconnection layer in which a second shield interconnection pattern fixed to a second potential is provided;
a third interconnection layer in which a first interconnection pattern to be shielded is provided;
a fourth interconnection layer in which a second interconnection pattern to be shielded is provided, the further interconnection layer being separated from the third interconnection layer;
a first connection part configured to connect the first, second, and third interconnection layers;
a second connection part configured to connect the first, second, and fourth interconnection layers; and
a third connection part configured to connect the first, third, and fourth interconnection layers, the first, second, third, and fourth interconnection layers and the first, second, and third connection parts being on a substrate of the semiconductor integrated device, wherein the third and fourth interconnection layers are provided between the first interconnection layer and the second interconnection layer, the first connection part connected the first shield interconnection pattern communicates from the first interconnection layer with the second interconnection layer through the third interconnection layer while opposing the first interconnection pattern to be shielded, the second connection part connected to the first shield interconnection pattern communicates from the first interconnection layer with the second interconnection layer through the fourth interconnection layer while opposing the second interconnection pattern to be shielded, and the third connection part connected to the first shield interconnection pattern passes between the first and second interconnection patterns to be shielded so as to communicate from the first interconnection layer with the third and fourth interconnection layers, so that the first shield interconnection pattern, the first and third connection parts connected thereto, and the second shield interconnection pattern surround the first interconnection pattern to be shielded, and the first shield interconnection pattern, the second and third connection parts connected thereto, and the second shield interconnection pattern surround the second interconnection pattern to be shielded, thereby shielding the first and second interconnection patterns to be shielded with the second shield interconnection pattern being shared between the first and second interconnection patterns to be shielded.

6. A semiconductor integrated device, comprising:

an analog circuit and a digital signal processing circuit mounted on a single chip; and a shield interconnection area in which an interconnection pattern to be shielded for an analog signal and an interconnection pattern to be shielded for a digital signal are disposed, the shield interconnection area separating the analog circuit and the digital signal processing circuit from each other, wherein the shield interconnection area has a configuration of the semiconductor integrated device as claimed in claim 5 so that the interconnection pattern to be shielded for the analog signal and the interconnection pattern to be shielded for the digital signal in the shield interconnection area are shielded separately.

* * * * *

UNITED STATES PATENT AND TRADEMARK OFFICE
CERTIFICATE OF CORRECTION

PATENT NO. : 7,576,382 B2  Page 1 of 1
APPLICATION NO. : 11/344191
DATED : August 18, 2009
INVENTOR(S) : Tsuyoshi Ueno It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 598 days.

Signed and Sealed this

Seventh Day of September, 2010

David J. Kappos
*Director of the United States Patent and Trademark Office*